United States Patent [19]

Inoue et al.

[11] 4,417,233

[45] Nov. 22, 1983

[54] FULLY PARALLEL THRESHOLD TYPE ANALOG-TO-DIGITAL CONVERTER

[75] Inventors: Michihiro Inoue, Ikoma; Toyoki Takemoto, Yawata; Haruyasu Yamada, Hirakata, all of Japan

[73] Assignee: Matsushita Electric Industrial Co., Ltd., Tokyo, Japan

[21] Appl. No.: 123,646

[22] Filed: Feb. 22, 1980

[30] Foreign Application Priority Data

Feb. 28, 1979 [JP] Japan .................................. 54-24005
Sep. 19, 1979 [JP] Japan ................................ 54-121158
Sep. 19, 1979 [JP] Japan ................................ 54-121159
Oct. 18, 1979 [JP] Japan ................................ 54-134968

[51] Int. Cl.³ .......................................... H03K 13/03
[52] U.S. Cl. .......................... 340/347 AD; 340/347 M
[58] Field of Search .... 340/347 AD, 347 M, 347 CC; 324/99 D; 370/7; 364/707; 318/594

[56] References Cited

U.S. PATENT DOCUMENTS

| | | | |
|---|---|---|---|
| 3,597,761 | 8/1971 | Fraschilla et al. | 340/347 AD |
| 3,737,894 | 6/1973 | Poretti et al. | 340/347 AD |
| 3,935,569 | 1/1976 | Marcel et al. | 340/347 AD |
| 4,143,366 | 3/1979 | Lewis, Jr. | 340/347 AD |
| 4,233,667 | 11/1980 | Devine et al. | 364/707 X |

OTHER PUBLICATIONS

The Engineering Staff of The Digital Equipment Corp., Analog-Digital Conversion Handbook, 1964, pp. 20-23.

Breuer, High-Speed A/D Converter Monolithic Techniques, 1972 IEEE International Solid-State Circuits Conference, pp. 146-147.

Kervhner et al., Alternating-Current Circuits, John Wiley & Sons, 1938, pp. 19, 20 & 129.

*Primary Examiner*—T. J. Sloyan
*Attorney, Agent, or Firm*—Burgess, Ryan & Wayne

[57] ABSTRACT

A parallel type A/D converter capable of operating at an extremely high speed with a high degree of accuracy and with low power consumption. A plurality of comparators each having a reference voltage corresponding to an assigned quantizing level are disposed in parallel with each other and divided into a plurality of comparator blocks or groups. A plurality of sub-comparators are provided so that prior to the comparison of the input signal by the comparators, the input signal is first compared with the reference voltages of the sub-comparators and in response to the output from the sub-comparator having the reference voltage comparable or corresponding to the incoming input signal, only the comparators in the comparator block or group associated with said sub-comparator are energized or enabled while the remaining comparators are kept de-energized or disabled, whereby a minimum power consumption may be attained.

4 Claims, 20 Drawing Figures

FULLY PARALLEL THRESHOLD TYPE ANALOG-TO-DIGITAL CONVERTER

BACKGROUND OF THE INVENTION

The present invention relates to a parallel type A/D analog-to-digital converter capable of operating at an extremely high speed with an extremely high degree of accuracy and with a minimum power consumption.

PCM recording systems require A/D converters capable of operating at high speed in the video band. In general, the A/D converters may be divided into the successive approximation type, the tracking type, the parallel threshold type and so on. In the parallel threshold type, a plurality of comparators each having a reference voltage corresponding to an assigned quantizing level are disposed in parallel with each other so that the analog input signal may be compared simultaneously with the reference voltages of the comparators. Therefore, the operation of the parallel threshold type A/D converter is faster than the other type A/D converters. In order for the parallel threshold type A/D converter to have a resolution of n bits, a number of $(2^n-1)$ comparators are needed, but the parallel threshold type is best adapted as a high-speed A/D converter for processing the analog input signal in the video band because the input analog signal may be simultaneously compared with all the reference voltages. However, the parallel threshold type A/D converter has a distinct disadvantage as, because of its large number of comparators, the power consumption becomes inevitably high. The present invention relates to a parallel threshold type A/D converter and a system capable of a reduction in power consumption.

SUMMARY OF THE INVENTION

A first feature of the present invention resides in the fact that a plurality of comparators, each having a reference voltage corresponding to an assigned quantizing level, are disposed in parallel with each other and divided into a plurality of comparator blocks or groups and prior to the comparison of the analog signal with the reference voltages of the comparators, the analog signal is compared with the reference voltages of sub-comparators so that in response to the output from the sub-comparators, the comparators only in the comparator block or group selected are energized or enabled, whereby a parallel type A/D converter with a minimum power consumption may be provided.

A second feature of the present invention resides in the fact that a plurality of comparator blocks or groups are selected and energized or enabled so that an accurate comparison of the input analog signal with the reference voltages of the comparators adjacent to the boundaries between the comparator blocks or groups may be ensured.

A third feature of the present invention resides in the fact that the number of the comparators in the comparator blocks or groups are determined based upon a predetermined weighting system in such a way that the comparator block or group consisting of the comparators, whose reference voltages correspond to the input signal whose level changes rapidly within a predetermined time interval, may include a large number of comparators while the comparator block or group consisting of the comparators, whose reference voltages correspond to the input signal whose level changes very slowly during a predetermined time interval, may include a relatively small number of comparators, whereby a more efficient reduction in power consumption may be attained.

A fourth feature of the present invention resides in the fact that the analog input signal terminal is connected to the sub-comparators through a phase (advance) circuit so as to compensate for the delay through the sub-comparators, whereby the difference in phase between the analog signal directly applied to the comparators and the output from the sub-comparators may be minimized as much as possible and consequently the A/D converter may process the high-frequency input signal with a higher degree of accuracy and an efficient reduction in power consumption may be attained.

DESCRIPTION OF THE PRIOR ART

Figure 1:
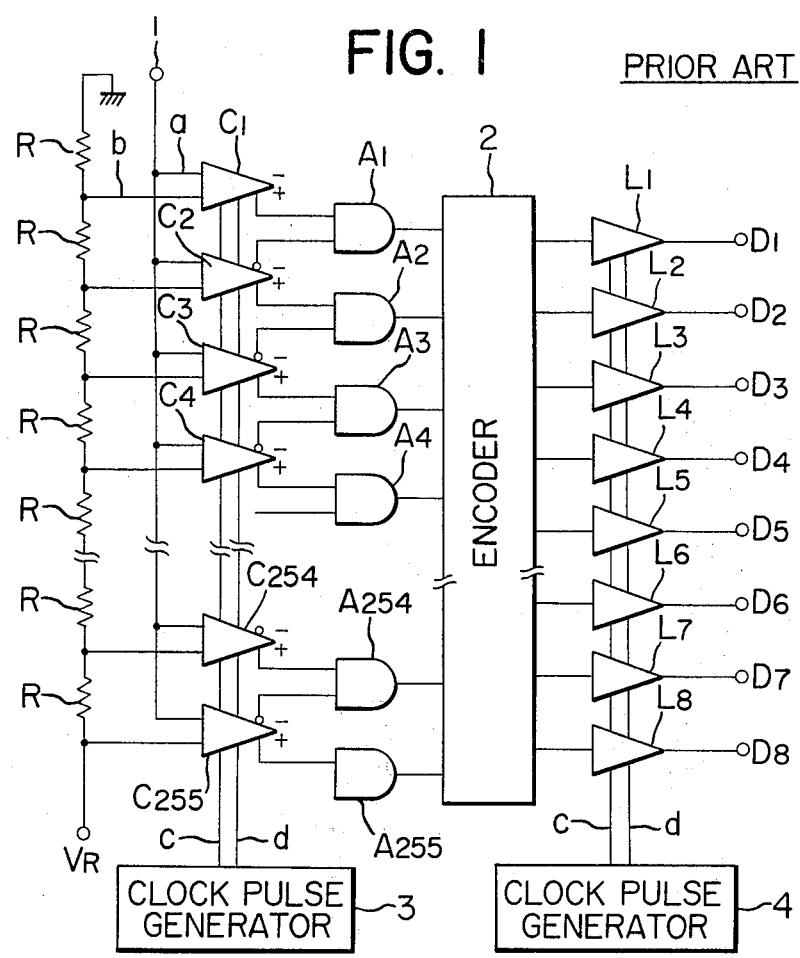
FIG. 1 is a block diagram of a prior art parallel threshold type A/D converter.
Figure 2:
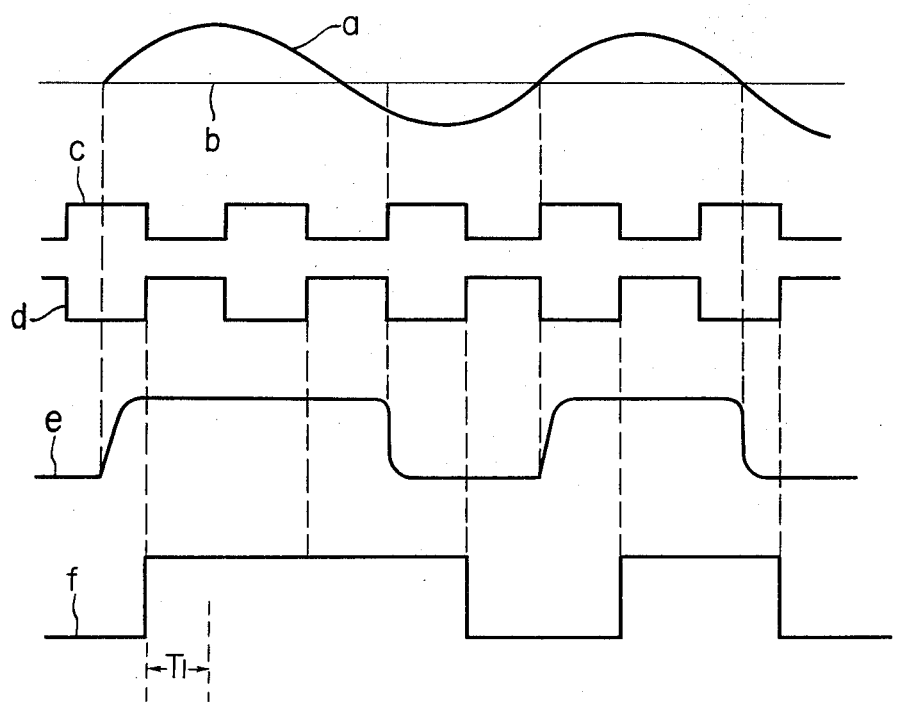
FIG. 2 shows the timing diagram thereof.

Referring to FIGS. 1 and 2, a prior art 8-bit parallel threshold A/D converter will be described. Rs are resistors which supply reference voltages to comparators. References $C_1$ through $C_{255}$ are comparators for comparing the reference voltages with each input analog signal, these comparators having the same resolution. $A_1$ through $A_{255}$ are AND gates. $L_1$ through $L_8$ are latching circuits. The numeral 1 is an analog signal input terminal; 2, an encoder consisting of a matrix of diodes, or the like; and 3 and 4, clock pulse generators coupled to the comparators $C_1$ through $C_{255}$ and to the latching circuits $L_1$ through $L_8$, respectively.

Next, the mode of operation will be described. Assume that the analog input signal a and the reference signal b are applied to the comparator $C_4$. The pulses c and d are applied from the clock pulse generator 3 to the comparator $C_4$. When the pulse c is high, comparing operation is effected, and when the pulse d is high, latching operation is effected. As a result, the comparator $C_4$ generates the comparison signal e, forms a waveshape and delivers the output signal f. Assume that during $T_1$ only the outputs from $C_1$ through $C_4$ are high. Then only the output from AND gate $A_4$ is high, said output being applied to the encoder 2. The outputs from the encoder 2 are applied to the latching circuits $L_1$ through $L_8$ and delivered to the terminals $D_1$ through $D_8$ which is in synchronism with the clock pulses c and d as the A/D converted outputs.

As described above, the 8-bit A/D converter includes as many as 255 comparators. As a result, when each comparator C consumes 1 mA, 255 mA must be supplied. When a power supply of 5 V is used, about 1.3 W is consumed only by the comparators C. The A/D converter itself consumes about 2 W. Thus, it is seen that the high-speed and high-precision parallel type A/D converters have a considerably high power consumption and consequently are not satisfactory in practice.

The present invention was made to overcome the above and other objections encountered in the prior art parallel type A/D converters and has for its object to provide a parallel type A/D converter with a reduced power consumption.

DETAILED DESCRIPTION OF THE PREFERRED EMBODIMENTS

Figure 3:
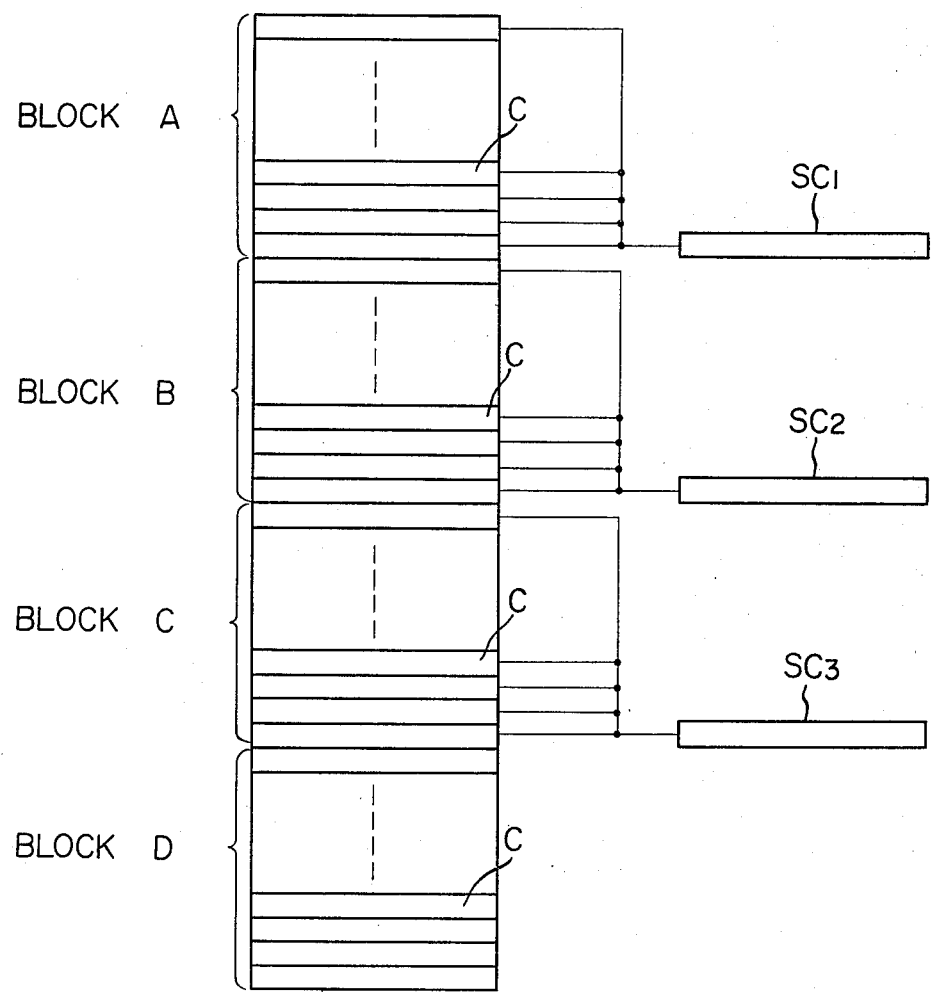
FIG. 3 is a block diagram used for an explanation of the underlying principle of the present invention.

Underlying Principle, FIG. 3

First referring to FIG. 3, the underlying principle of the present invention will be described. The character C represents comparators arranged in parallel so as to correspond to the quantizing levels. References $SC_1$ through $SC_3$ are sub-comparators. The underlying principle of the present invention is as follows. As shown in FIG. 3, the comparators C, which are arranged in parallel, are divided into a few blocks (four A through D blocks in FIG. 3), and the sub-comparators are disposed so that they have the same discriminating or comparison level as the comparator C which detects the voltage across the boundary between the adjacent blocks. In operation, the sub-comparators $SC_1$ through $SC_3$ first detect in which of blocks A through D an input signal voltage falls; and only one block (whose discriminating or reference level encompasses the input signal voltage) is actuated, while the remaining blocks are not supplied with current or are supplied with a very small amount of current, whereby the overall power consumption of the A/D converter may be reduced to a considerable degree. TABLE 1 below shows the conditions of the sub-comparators SC and the blocks A through D.

TABLE 1

| | | | | | |
|---|---|---|---|---|---|
| output of sub-comparators | $SC_1$ | 0 | 0 | 0 | 1 |
| | $SC_2$ | 0 | 0 | 1 | 1 |
| | $SC_3$ | 0 | 1 | 1 | 1 |
| ON/OFF of blocks | A | OFF | OFF | OFF | ON |
| | B | OFF | OFF | ON | OFF |
| | C | OFF | ON | OFF | OFF |
| | D | ON | OFF | OFF | OFF |

For instance, assume that the analog input voltage is within the range of the block B; that is, it is equal to the quantizing level of one of the comparators in the block B. Then, the sub-comparator $SC_1$ detects that the analog input voltage is lower than the reference level of the sub-comparator $SC_1$ so that the output becomes 0. On the other hand, the sub-comparators $SC_2$ and $SC_3$ detect that the analog input voltage is higher than their reference levels so that they deliver the outputs "1". Therefore, it follows that only the comparators in the block B are actuated while the remaining comparators are kept disabled, but the correct conversion of the analog input voltage signal into a digital signal may be carried out by the comparators in the block B. Assume that during this operation period, no current is supplied to the blocks A, C and D. Then the overall power consumption of the A/D converter may be decreased to about ¼ as compared with the A/D converter in which all of the comparators are normally kept enabled or energized. From the above description, it is readily seen that the higher the number of blocks and the higher the number of sub-comparators SC, the lower the power consumption becomes. However, it should be noted that when the number of sub-comparators is increased beyond a certain number, the power consumption of the sub-comparators will inevitably exceed the power reduction attained by the reduction of the number of comparators C. For instance, assume that 255 comparators in an 8-bit A/C converter is divided into 16 blocks, then, the minimum power consumption may be attained. That is, the power or current consumption may be reduced to about ⅛.

Figure 4:
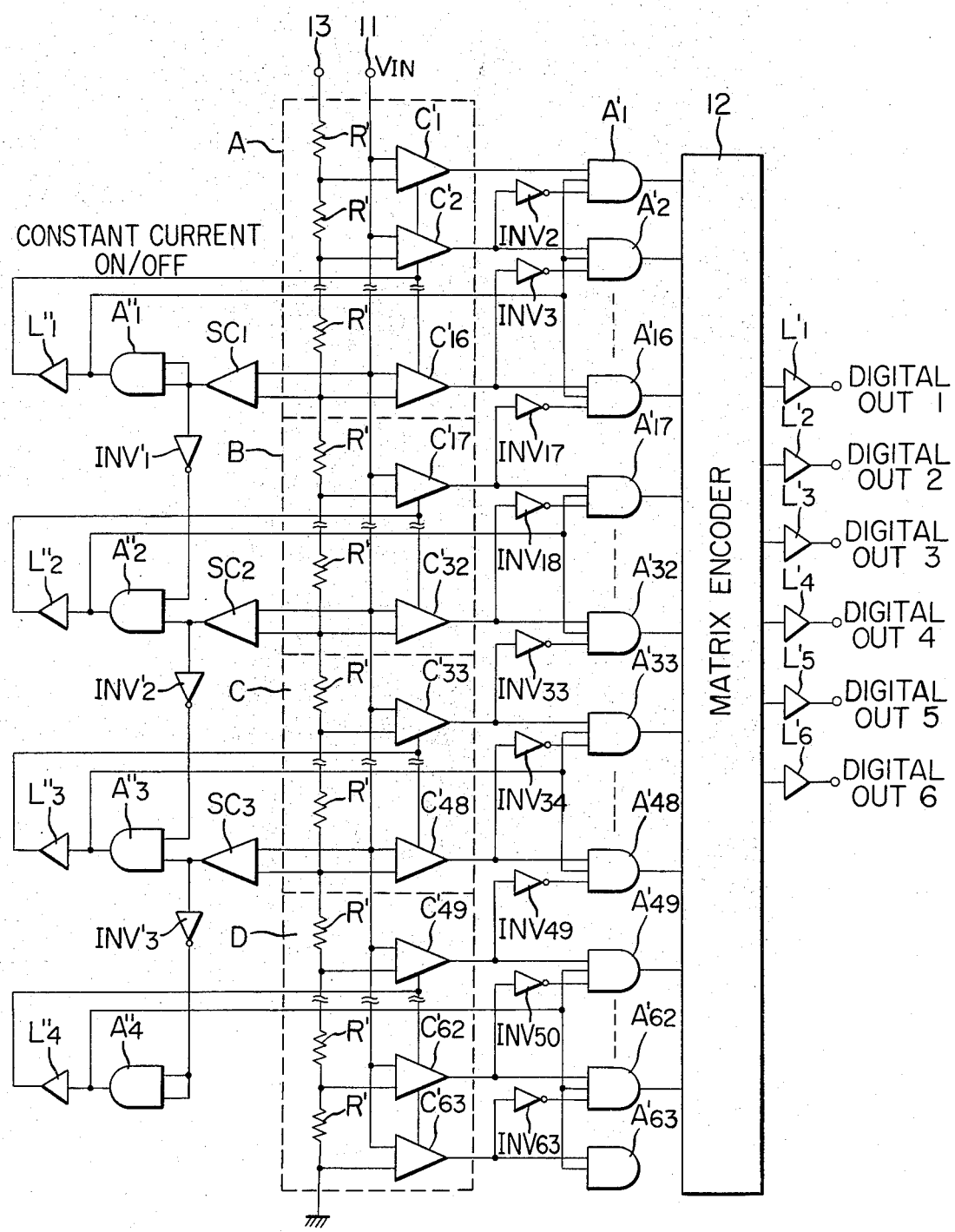
FIG. 4 is a block diagram of a first embodiment of the present invention.

First Embodiment, FIG. 4

In the first embodiment shown in FIG. 4, the numeral 11 is an analog input terminal; 12, a matrix encoder; 13, a reference voltage input terminal; and $C'_1$ through $C'_{63}$, comparators, each comparing the analog input voltage $V_{in}$ with a voltage obtained by the division of the reference voltage. The character R' denotes resistors in a reference voltage divider. Inverters $INV_2$ through $INV_{63}$ invert the outputs from the comparators $C'_2$ through $C'_{63}$. $A'_1$ through $A'_{63}$ are three-input AND gates. The output from the associated comparator is directly applied to a first input; the output from the adjacent comparator to the next higher order is applied through the inverter INV to a second input; and the output from a sub-comparator to be described below is applied to a third input. $L'_1$ through $L'_6$ are output buffers which decrease or lower the output impedance and change the level of the output. The components and arrangements described above are substantially similar to those of the prior art parallel type A/D converters, but according to the present invention, the components described below are also included.

First, three sub-comparators $SC_1$ through $SC_3$ are provided to which are applied three reference voltages, respectively, which may equally divide the comparators $C'_1$ through $C'_{63}$ into four blocks. In the first embodiment, the quantizing levels of the 16-th, 32-nd and 48-th comparators are applied to the sub-comparators $SC_1$ through $SC_3$, respectively. That is, the quantizing levels of the sub-comparators $SC_1$ through $SC_3$ are equal to those of the comparators $C'_{16}$, $C'_{32}$ and $C'_{43}$. $INV'_1$ through $INV'_3$ are inverters for inverting the outputs from the sub-comparators $SC_1$ through $SC_3$, respectively. $A''_1$ through $A''_4$ are AND gates. The output from the first sub-comparator $SC_1$ is applied to AND gate $A''_1$; the output from the first inverter $INV'_1$ and the output from the second sub-comparator $SC_2$ are applied to AND gate $A''_2$; and the outputs from $INV'_2$ and $SC_3$ are applied to AND gate $A''_3$. The output from the inverter $INV'_3$ is applied to AND gate $A''_4$. AND gate $A''_1$ and $A''_4$ may be eliminated. $L''_1$ through $L''_4$ are buffer drivers which turn on and off the currents supplied to the blocks of the comparators $C'_1$ through $C'_{63}$. In the first embodiment, the first block A includes the comparators $C'_1$ through $C'_{16}$; the second block B, $C'_{17}$ through $C'_{32}$; the third block, $C'_{33}$ through $C'_{48}$; and the fourth block D, from $C'_{49}$ to $C'_{63}$.

Next, the mode of operation of the first embodiment with the above construction will be described. The analog input signal applied to the input terminal 11 is compared with the quantizing levels of the sub-comparators $SC_1$ through $SC_3$. In the first embodiment, it is assumed that when the reference voltage of 1 V is applied to the reference voltage terminal 13, the quantizing levels of the sub-comparators $SC_1$ through $SC_3$ are 0.75 V, 0.5 V and 0.25 V, respectively. When the input signal is 0.6 V, it is lower than the quantizing level of the sub-comparators $SC_1$, so that the latter delivers the output "0". As a result, the outputs from the inverters $INV'_1$, $INV'_2$ and $INV'_3$ become "1", "0" and "0", respectively, and both the inputs to the second AND gate $A''_2$ are "1"s, but the remaining AND gates $A''_1$, $A''_3$ and $A''_4$ receive "0" and "1" or "0" and "0". As a result, "1" output may be derived only from AND gate $A''_2$ while "0" outputs are derived from the remaining AND gates. The outputs of AND gates $A''_1$ through $A''_4$ are connected to the third inputs of AND gates $A'_1$ through $A'_{63}$ which are interposed between the comparators $C'$ and the encoder 12. More specifically, the ouput of the first AND gate $A''_1$ is connected to the third input terminals of the AND gates $A'_1$ through $A'_{16}$; the output of AND gate $A''_2$, to the third inputs of AND gates $A'_{17}$ through $A'_{32}$; the output of the third AND gate $A''_3$, to the third input terminals of AND gate $A'_{33}$ through $A'_{48}$; and the output from AND gate $A''_4$, to the third input terminals of AND gates $A'_{49}$ through $A'_{63}$. Therefore, when the output from AND gate $A''_2$ is "1" while the outputs from the remaining AND gates $A'_1$, $A''_3$ and $A''_4$ are "0"s, only the AND gates from $A'_{17}$ to $A'_{32}$ in the block B are opened for transmission while AND gates in the remaining blocks A, C and D are closed. The array of AND gates $A'_1$ through $A'_{63}$ ensures the correct operation of the encoder 12; that is, the correct application of only desired inputs to the encoder 12 regardless of the output conditions of the comparators $C'_1$ through $C'_{63}$. The buffer drivers $L''_1$ through $L''_4$ control the supply of current to the blocks A, B, C and D of the comparators $C'_1$ through $C'_{63}$ as described elsewhere. That is, the buffer drivers $L''_1$ through $L''_4$ are so designed and arranged so that when and only when they receive the input "1", they may actuate or enable their associated comparators $C'$. Therefore when only the AND gate $A''_2$ delivers the output "1" to the second buffer driver $L''_2$, the latter enables only the comparators $C'_{17}$ through $C'_{32}$ in the block B which are associated with the second buffer driver $L''_2$. The remaining comparators $C'$ remain disabled or de-energized. As a consequence, only 16 comparators $C'$ in the block B are enabled so that the overall current consumption of the A/D converter may be reduced by about one quarter. However, it should be noted that the three sub-comparators $SC_1$ through $SC_3$ must be normally kept energized so that the current consumption is increased accordingly, but their current consumption is almost negligible as compared with the arrangement in which all of the comparators $C'$ are normally kept energized.

So far only the operation of the comparators in the block B has been described, but from TABLE 2 below it will be apparent to those skilled in the art how the comparators in one block are enabled while those in the remaining blocks are kept de-energized TABLE 2 shows the relationship between the analog input voltage and the conditions of the sub-comparators, the comparators $C'$ in each block A, B, C and D and AND gate blocks associated therewith.

TABLE 2

| analog input voltage | | 0 to 0.25 V | 0.25 to 0.5 V | 0.5 to 0.75 V | 0.75 to 1 V |
|---|---|---|---|---|---|
| sub-comparator | $SC_1$ | 0 | 0 | 0 | 1 |
| | $SC_2$ | 0 | 0 | 1 | 1 |
| | $SC_3$ | 0 | 1 | 1 | 1 |
| comparator block | A | OFF | OFF | OFF | ON |
| | B | OFF | OFF | ON | OFF |
| | C | OFF | ON | OFF | OFF |
| | D | ON | OFF | OFF | OFF |
| AND gate block | A | 0 | 0 | 0 | — |
| | B | 0 | 0 | — | 0 |
| | C | 0 | — | 0 | 0 |
| | D | — | 0 | 0 | 0 |

Next, the two methods for dividing the comparators into blocks will be described. In the method just described above, the comparators $C'_1$ through $C'_{63}$ are divided into four blocks A through D without overlapping, and three sub-comparators $SC_1$ through $SC_3$ are disposed between the boundaries of the blocks A through D in such a way that in response to the "1" output from one of the three sub-comparators $SC_1$ through $SC_3$, its associated comparators are enabled. However, according to this method, the quantizing level of the sub-comparator must be maintained within ½ LSB of the associated comparator. In order to attain a higher degree of accuracy, the resistors $R'$ of the reference voltage divider must be formed in the same pattern so that the sub-comparators $SC_1$ through $SC_3$ cannot be formed at the same places as the comparators $C'_1$ through $C'_{63}$. As a result, they are different in characteristics. Therefore the following methods or arrangements are effective in avoiding any erratic operations.

Figure 5:
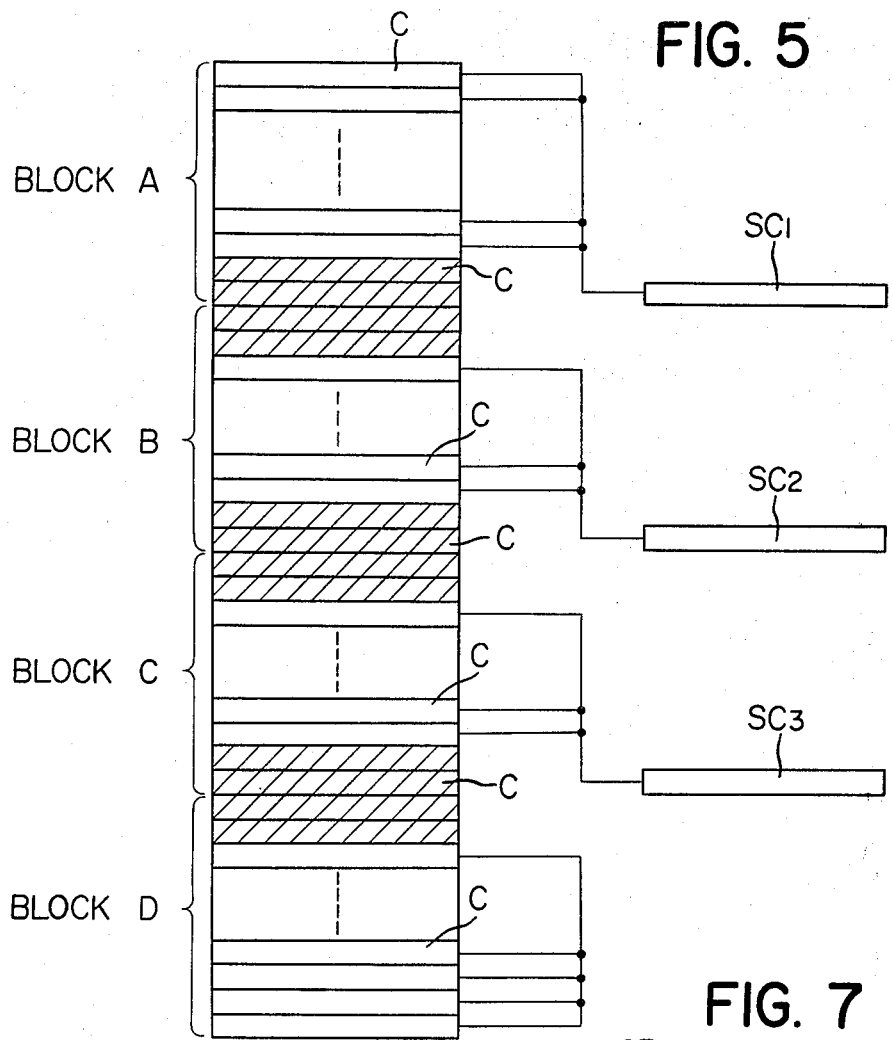
FIG. 5 is a block diagram used for an explanation of the underlying principle of a second embodiment of the present invention.

Second Embodiment FIG. 5

In the second embodiment shown in FIG. 5, the comparators C (hatched ones) which are adjacent to the boundaries between the blocks A through D are normally kept energized; that is, they are not controlled by the sub-comparators $SC_1$ through $SC_3$ as in the case of the first embodiment. The sub-comparators $SC_1$ through $SC_3$ control the comparators except those adjacent to the boundaries. That is, even when the sub-comparator $SC_1$ is erratically actuated in response to the input voltage whose level is almost equal to the quantizing level of the comparator at the boundary, the analog input voltage may be compared with the quantizing levels of the comparators which are disposed adjacent to the boundaries between the blocks and are normally energized so that any erratic conversion may be avoided.

Figure 6:
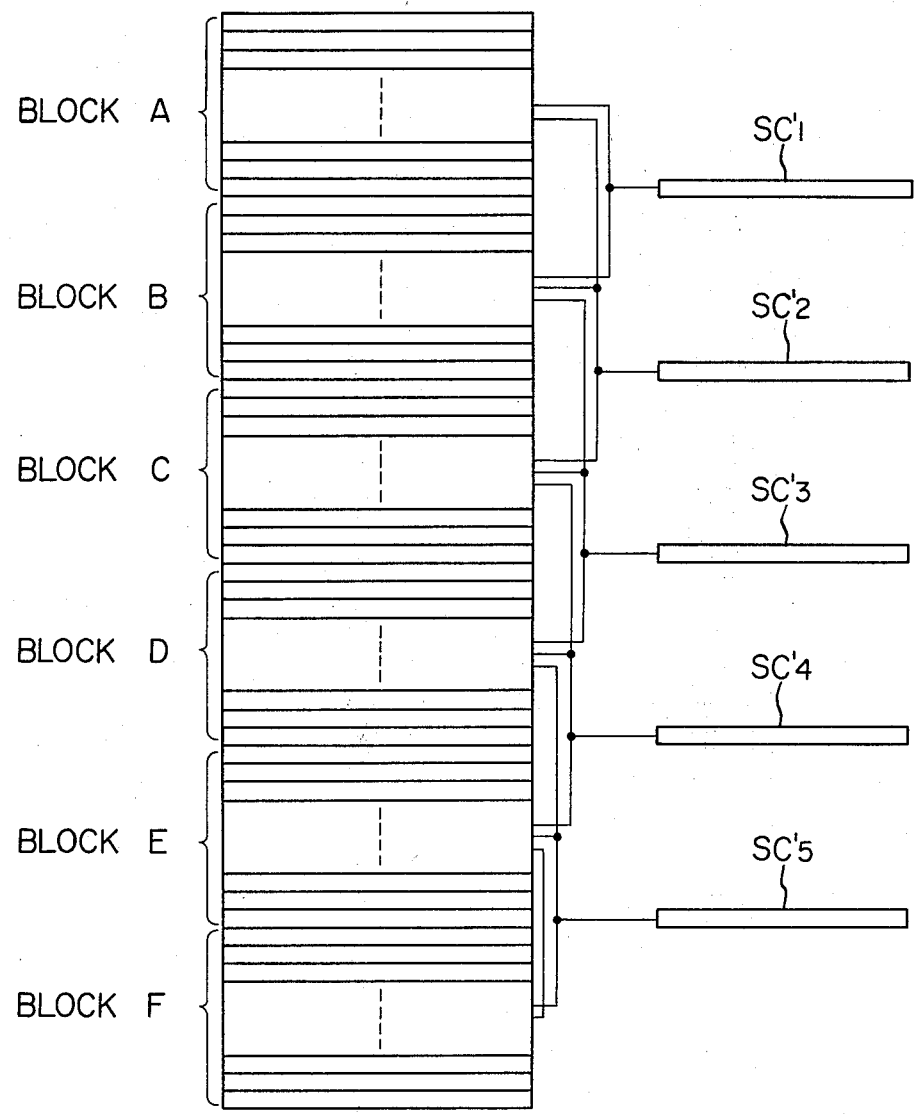
FIG. 6 is a block diagram used for an explanation of the underlying principle of a third embodiment of the present invention.

Third Embodiment, FIG. 6

In the third embodiment shown in FIG. 6, in response to the outputs from the sub-comparators $SC'_1$ through $SC'_5$, not only is the comparator block energized which includes a comparator whose quantizing level is equal to or almost equal to the analog input voltage, but the comparator blocks adjacent to the first-mentioned block are also energized. For instance, assume that, as shown in TABLE 3 below, the output from the sub-comparators $SC'_1$ through $SC'_3$ is "0"s while the outputs from $SC'_4$ and $Sc'_5$ are "1"s, then the analog input voltage is equal to the quantizing level of one of the comparators in the block D. Therefore, the comparators not only in the block D but also in the blocks C and E are all actuated or energized. The third embodiment shown in FIG. 6 is advantageous over the second embodiment or arrangement shown in FIG. 5 in that it is not needed to normally operate some of the comparators. The advantages of the third embodiment may be attained only when the number of comparator blocks is increased beyond the number utilized in the second embodiment so that the number of comparators which are simultaneously enabled may be decreased.

TABLE 3

| outputs from sub-comparators | $SC'_1$ | 0 | 0 | 0 | 0 | 0 | 1 |
|---|---|---|---|---|---|---|---|
| | $SC'_2$ | 0 | 0 | 0 | 0 | 1 | 1 |
| | $SC'_3$ | 0 | 0 | 0 | 1 | 1 | 1 |
| | $SC'_4$ | 0 | 0 | 1 | 1 | 1 | 1 |
| | $SC'_5$ | 0 | 1 | 1 | 1 | 1 | 1 |
| comparator blocks | A | OFF | OFF | OFF | OFF | ON | ON |
| | B | OFF | OFF | OFF | ON | ON | ON |
| | C | OFF | OFF | ON | ON | ON | OFF |
| | D | OFF | ON | ON | ON | OFF | OFF |
| | E | ON | ON | ON | OFF | OFF | OFF |
| | F | ON | ON | OFF | OFF | OFF | OFF |

Figure 7:
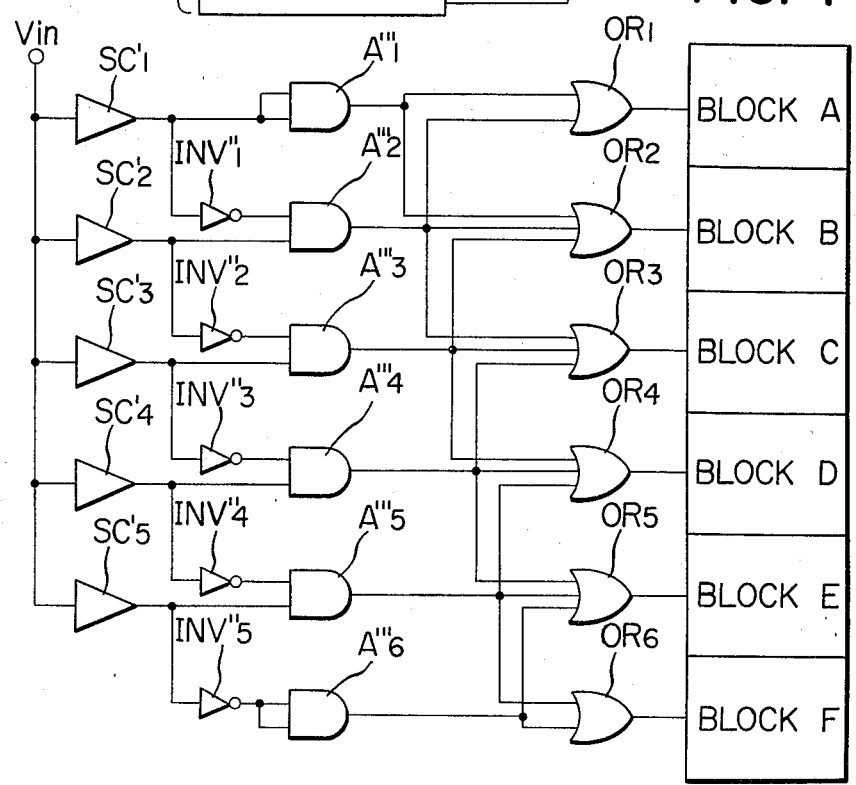
FIG. 7 is a block diagram of the third embodiment of the present invention.

The third embodiment will be described in more detail with reference to the block diagram shown in FIG. 7. $SC'_1$ through $SC'_5$ are sub-comparators. The outputs from the sub-comparators $SC'_1$ through $SC'_5$ are inverted by inverters $INV'''_1$ through $INV'''_5$ and applied to one inputs of AND gates $A'''_2$ through $A'''_5$ and to only one input of AND gate $A'''_6$. The outputs from the sub-comparators $SC'_1$ through $SC'_5$ are directly applied to the other inputs of AND gates $A'''_1$ through $A'''_5$. $OR_1$ through $OR_6$ are OR gates. The outputs from AND gates $A'''_1$, $A'''_2$ are applied to OR gate $OR_2$ so that when one of the outputs from AND gates $A'''_1$, $A'''_2$ and $A'''_3$ are "1"s, the output from $OR_2$ becomes "1", in response to which the comparator block B is enabled. The output from AND gate $A'''_2$ are connected to three OR gates $OR_1$, $OR_2$ and $OR_3$ so that when the output from AND gate $A'''_2$ is "1", all of the outputs from OR gates $OR_1$, $OR_2$ and $OR_3$ become "1"s so that the comparator blocks A, B and C are enabled simultaneously. The simultaneous actuation of three adjacent blocks will be apparent when reference is made to TABLE 3 above.

Figure 8:
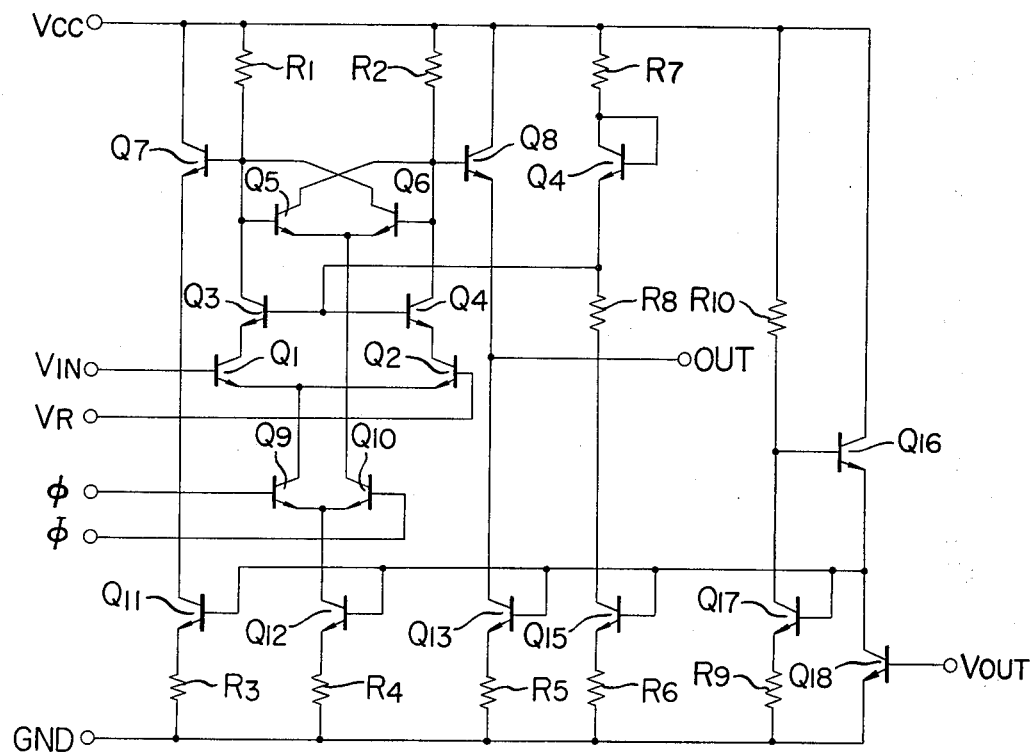
FIG. 8 is a block diagram of a comparator in accordance with the present invention.

First Embodiment of Comparator Control System, FIG. 8

Next referring to FIG. 8, the construction of the comparators C' and their associated circuitry for controlling them will be described. The comparator C' is of the ECL differential type and consists of $Q_1$ through $Q_{15}$ and $R_1$ through $R_8$. $Q_1$ and $Q_2$ are a differential amplifier pair for comparing the analog input voltage $V_{IN}$ applied to the base of $Q_1$ with the reference voltage $V_R$ applied to the base of $Q_2$. $Q_3$ and $Q_4$ are a cascade transistor pair for eliminating the mirror effects from the transistor pair $Q_1$ and $Q_2$. Fixed bias voltages are applied through resistors $R_7$ and diode $Q_{14}$ to the bases of transistor pair $Q_3$ and $Q_4$. A transistor pair $Q_5$ and $Q_6$ has a holding or latching function and constitutes the so-called latching circuit. $Q_7$ and $Q_8$ are emitter-follower transistors for impedance conversion; $Q_{11}$, $Q_{12}$, $Q_{13}$ and $Q_{15}$ constitute a constant current circuit. $Q_{14}$ is a bias diode, $R_1$ and $R_2$ are load resistors of the differential amplifier transistor pair and the latching circuit described above. $R_3$, $R_4$, $R_5$, $R_6$ and $R_9$ are resistors inserted into the constant current circuit described above, the magnitude of current being depending upon the ratios therebetween. $Q_9$ and $Q_{10}$ are switching transistors which respond to the clocks $\phi$ and $\bar{\phi}$ so as to switch between the comparator operation by $Q_1$ and $Q_2$ and the holding or latching operation by $Q_5$ and $Q_6$. References $R_9$, $R_{10}$, $Q_{16}$ and $Q_{17}$ constitute a reference current circuit, the value of the resistor $R_{10}$ determining the magnitude of the reference current. In addition, a transistor $Q_{18}$ is added which controls the current which in turn controls the overall operation of the comparator. When the transistor $Q_{18}$ is disabled or no current flows from the collector to emitter, the constant currents flow which are dependent upon the value of the resistor $R_{10}$. When the transistor $Q_{18}$ is enabled in response to $V_{COT}$, the base potential of $Q_{17}$ becomes almost equal to GND (ground potential) so that no collector current flows through $Q_{11}$, $Q_{12}$, $Q_{13}$ and $Q_{15}$ and consequently, comparator C' is de-energized. Therefore, it follows that when the terminal $V_{COT}$ is connected to the output of the buffer driver L" (See FIG. 4), the operation or energization and de-energization of the comparator C' may be controlled in response to the output from the sub-comparator SC in the manner described herein. One comparator block includes from a few to tens of comparators C' of the type shown in FIG. 7, and the buffer drivers $L''_1$ through $L''_4$ shown in FIG. 4 may simultaneously control the transistors $Q_{18}$ in each comparator block.

The above-described comparator operating current control system is advantageous in that the circuitry is simple in construction, but has the disadvantage in that by virtue of the saturation of the transistor $Q_{18}$, the high-speed switching operation cannot be attained. But according to the present invention, the high-speed operation may be accomplished as will be described below.

Figure 9:
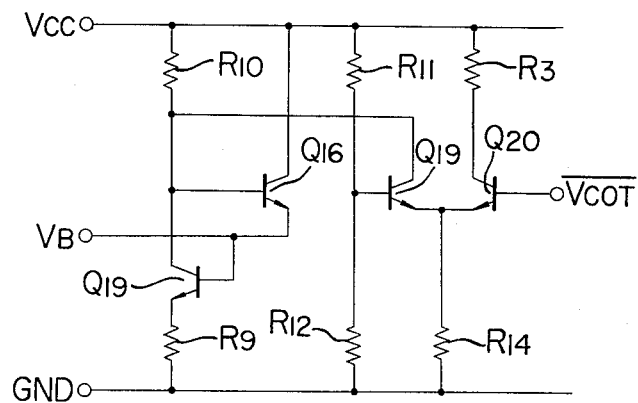
FIG. 9 is a diagram of a circuit for controlling the current supplied to operate the comparators in accordance with the present invention.

Second Embodiment of Comparator Control System, FIG. 9

In the comparator control system shown in FIG. 9, the comparator C' is not shown for the sake of simplicity and only a circuitry for determining the reference current supplied to a constant current circuit and a switching circuit is shown. The switching circuit consists of resistors $R_{11}$, $R_{12}$, $R_{13}$ and $R_{14}$ and transistors $Q_{19}$ and $Q_{20}$. The functions of the transistors $Q_{16}$, $Q_{17}$ and resistors $R_9$ and $R_{10}$ have been already described in detail with reference to FIG. 8.

In order to energize or enable the comparator, the voltage $V_{COT}$ is raised above the base voltage of the transistor $Q_{19}$ so that the latter is disabled or turned off. As a result, the current flowing through the resistor $R_{10}$ flows as the base current of the transistor $Q_{16}$ and as the collector current of the transistor $Q_{17}$, whereby a base voltage $V_B$ of a predetermined magnitude is generated. It is this voltage $V_B$ that is the control voltage for all the constant current circuits in the comparator C' so that the comparator is enabled or energized. When the voltage $V_{COT}$ drops below the base potential of the transistor $Q_{19}$, the transistor $Q_{20}$ is disabled or turned off while the transistor $Q_{19}$ is turned on. The value of the resistor $R_{14}$ is small so that the magnitude of current flowing through $Q_{19}$ is high and consequently, almost all the current flowing through the resistor $R_{10}$ flows into the collector of the transistor $Q_{19}$. As a result, the base voltage or potential $V_B$ of the transistor $Q_{17}$ drops and consequently, the magnitudes of currents supplied from the constant current circuits are decreased. As a consequence, the current for operating the comparator drops. In summary, in order to enable the comparator, the voltage $V_{COT}$ is raised to a high level and in order to de-energize the comparator, $V_{COT}$ is lowered to a low level. This system is featured in that the switching transistors $Q_{19}$ and $Q_{20}$ may be operated without driving them into saturation whereby the high-speed operation may be accomplished.

In FIG. 9, $\overline{V_{COT}}$ represents the inverted signal of $V_{COT}$ in FIG. 8 that is, the inverted signal of the output from the buffer driver L" shown in FIG. 4.

AND gates $A'_1$ through $A'_{63}$

Figure 10:
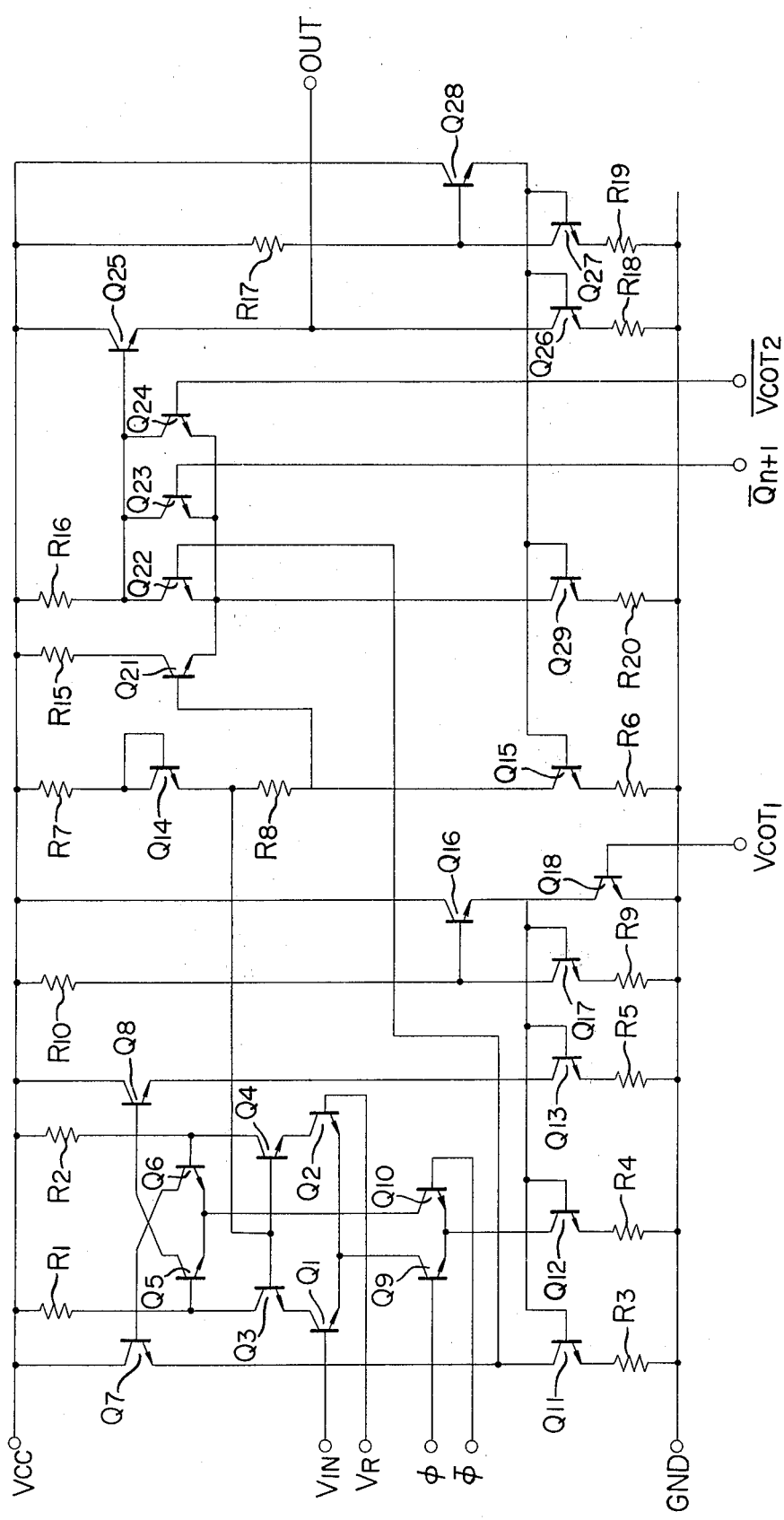
FIG. 10 is a diagram of the comparator and AND gate in accordance with the present invention.

Next, AND gates $A'_1$ through $A'_{63}$ which are interposed between the comparators $C'_1$ through $C'_{63}$ on the one hand and the encoder 12 (See FIG. 4) will be described in more detail below. In the prior art A/D converters, AND gate produces the logic product of the output from the n-th comparator and the inverted output from the (n+1)-th comparator so that only the comparator whose quantizing level corresponds to the level of the analog input voltage may produce the output "1" which in turn is converted into a binary signal through the encoder 12. According to the present invention, three-input AND gates are used so that they may produce "0" outputs in response to the outputs from the sub-comparators, whereby the associated comparator blocks may be kept de-energized in the manner described herein. Referring to FIG. 10, the components and their functions of the transistors $Q_1$ through $Q_{18}$ and resistors $R_1$ through $R_9$ have already been described with particular reference to FIG. 8. AND gate consists of transistors $Q_{21}$ through $Q_{29}$ and resistors $R_{15}$ through $R_{20}$. Opposed to the circuitry shown in FIG. 8, the bias circuit consisting of transistors $Q_{14}$ and $Q_{15}$ and resistors $R_6$, $R_7$ and $R_8$ supplies the base bias to the differential transistor $Q_{21}$ in AND gate and is connected to a second reference current circuit consisting of resistors $R_{17}$ and $R_{19}$ and transistors $Q_{27}$ and $Q_{28}$. Transistors $Q_{21}$, $Q_{22}$, $Q_{23}$ and $Q_{24}$ constitute an ECL AND gate with resistors $R_{15}$ and $R_{16}$ as loads. Transistor $Q_{29}$ and resistor $R_{20}$ constitute a constant current circuit. The emitter-follower transistor $Q_{25}$ is connected to a constant circuit consisting of transistor $Q_{26}$ and resistor $R_{18}$ for decreasing the output impedance. The inverted output of the preceding comparator is connected to the base of the transistor $Q_{22}$. The output from the succeeding $(Q_n+1)$ comparator is connected to the base of the transistor $Q_{23}$. The output $V_{COT2}$ from AND gate A is connected to the base of the transistor $Q_{24}$. As a result, when and only when $V_{COT2}$ is at a low level, the AND gate is opened; that is, the logic product of the output of one comparator (Q) and the inverted output of the next stage comparator $(Q_n+1)$ is produced. While AND gates $A'_1$ through $A'_{63}$ are illustrated in FIG. 4, the actual circuitry employed to provide these logical operations, as shown in FIG. 10, constitute negative logic OR circuits. When $V_{COT2}$ is at a high level, the output at OUT is forced to drop to a low level so that even when the comparator is kept de-energized, the correct signal may be applied to the input of the encoder 12.

As is apparent from the above description, the present invention is featured in that prior to the precise comparison of the analog input signal with the quantizing level thereof by one comparator, one of the sub-comparators makes a rough comparison so that only the comparators in one block, whose range of quantizing levels encompasses the level of the analog input voltage, may be energized, whereby a minimum current consumption may be attained. As a result, the prior art methods for timing the operation of comparators cannot be employed in the present invention. That is, during one period for the prior art converters for accomplishing one comparison, the comparison by the sub-comparators must be effected and the required switching between the comparator control circuits or systems must be accomplished.

To this end, a scheme in which the clock frequency employed in the prior art A/D converters is doubled and the cycle consisting of the steps of auxiliary or preliminary comparison, switching and final or precise comparison may be repeated. But this scheme is not preferable because the time interval between the auxiliary or preliminary comparison and switching periods is needlessly wasted. Therefore, according to the present invention, the clock frequency remains unchanged, but the latching of the comparator and the turning on and off of the current supplied to the comparator block are accomplished within the same time interval as will be apparent from the following description.

Figure 11:
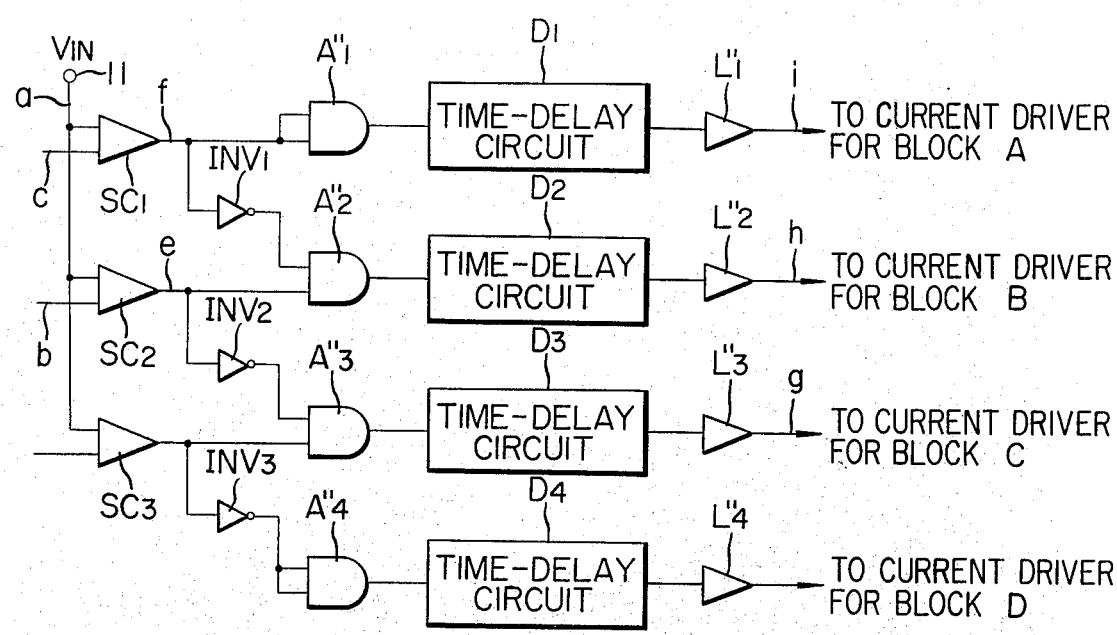
FIG. 11 is a block diagram used for an explanation of a first clock system in accordance with the present invention.
Figure 12:
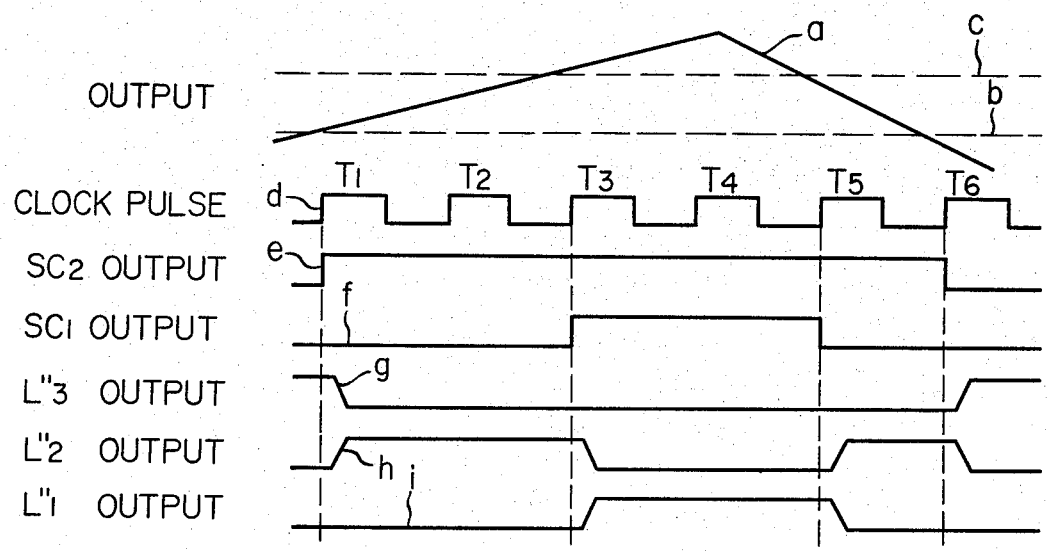
FIG. 12 shows a timing diagram used for an explanation of the first clock system.

First Embodiment of Clock System, FIGS. 11 and 12

Referring first to FIG. 11, the sub-comparators $SC_1$ through $SC_3$, AND gates $A''_1$ through $A''_4$, inverters $INV'_1$ through $INV'_3$ and buffers $L''_1$ through $L''_4$ have been already described in detail with reference to FIG. 4. References $D_1$ through $D_4$ are time-delay circuits having the same time delay.

Next referring further to FIG. 12, the mode of operation of the circuitry shown in FIG. 11 will be described. In response to the analog signal a applied to the input terminal 11, the sub-comparators $SC_1$ through $SC_3$ which are actuated in response to the clock d, compare the analog input voltage with the reference voltages when the clock pulse is at a low level, and the sub-comparators are latched when the clock pulse rises to a high level. At $T_1$, the analog input signal a is higher than the reference voltage or quantizing level b of the second sub-comparator $SC_2$ so that the output therefrom rises to a high level "H". This high-level output is inverted by the inverter $INV'_2$ and applied to one input of AND gate $A''_3$. As a result, the output from AND gate $A''_3$ drops to a low level "L". The low-level output is then delayed by a predetermined time interval by the time-delay circuit $D_3$ and is applied to the buffer $L''_3$. In response to the output g from the buffer $L''_3$, the current supply to the comparator block C is delayed behind the timer $T_1$ when the latching is started. The comparators in the block C are latched during the latching period after $T_1$. The time-delay circuit $D_1$ may consist of a plurality of gate circuits connected in series so that the output from comparators in the block C may be transmitted to the next stage before the supply of current to the block C is interrupted.

At the time when the supply of current to the block C is interrupted, the output of AND gate $A''_2$ rises to a high level "H". The output from AND gate $A''_2$ is delayed by a predetermined interval of time by the time-delay circuit $D_2$ and applied to the buffer $L''_2$ which in turn produces the signal h, enabling the comparators in the block B. Therefore, at $T_2$, the comparators in the block B having the quantizing levels between the reference voltages b and c are latched. At $T_3$, the analog input signal a rises above the reference voltage c so that the output signal f of the sub-comparator $SC_1$ rises to a high level "H". The high-level output signal from the sub-comparator $SC_1$ is applied directly to AND gate $A''_1$ and to AND gate $A''_2$ through the inverter $INV'_1$. The outputs from AND gates $A''_1$ and $A''_2$ are applied through the time-delay circuits $D_1$ and $D_2$ to the buffers $L''_1$ and $L''_2$, respectively, which in turn generate the signals i and h so that the comparators in the block A are enabled while those in the block B are disabled. During the time delay, the outputs from the comparators in the block B are transferred to the next stage.

At $T_4$, the comparators in the block A whose quantizing levels are higher than the reference voltage c are operating in response to the signal i. At $T_5$, the comparators in the block B whose quantizing levels are between the reference voltages b and c which are enabled or energized in response to the signal h which rises to a high level as shown in FIG. 12 and during the time delay, the outputs from the comparators in the block A are transmitted to the next stage. At $T_6$, the comparators in the block b are kept energized but they are soon disabled so that there must be provided a sufficient time delay for permitting the transfer of the outputs from the comparators in the block B to the next stage.

As described above, the power switch has the time delay function so that, during the holding period of the comparators, the comparison by the sub-comparators for the next cycle and the switching operation of the operating current supplied to the comparators are accomplished. In addition, the comparison by the sub-comparators is started immediately after the holding is started, and after a suitable time delay, the switching operation is started, so that the clock pulses used in the conventional A/D converters may be used without any modification. Therefore, the clock rate may be reduced by ½. However, the outputs of the sub-comparators $SC_1$ through $SC_3$ and the outputs from the comparators in the blocks A through D are delayed by one clock pulse interval.

As described above, according to the present invention, the sub-comparators are used and in response to the outputs therefrom, some of the comparators are disabled. However, when the analog input signal is the video signal which varies rapidly, there is a problem. That is, when the current is supplied to the comparators in the selected block, ringing results due to the rising characteristics of the power supply so that the voltage will not settle to a predetermined level. This problem may be overcome by the second embodiment of the clock system in accordance with the present invention to be described below.

Figure 13:
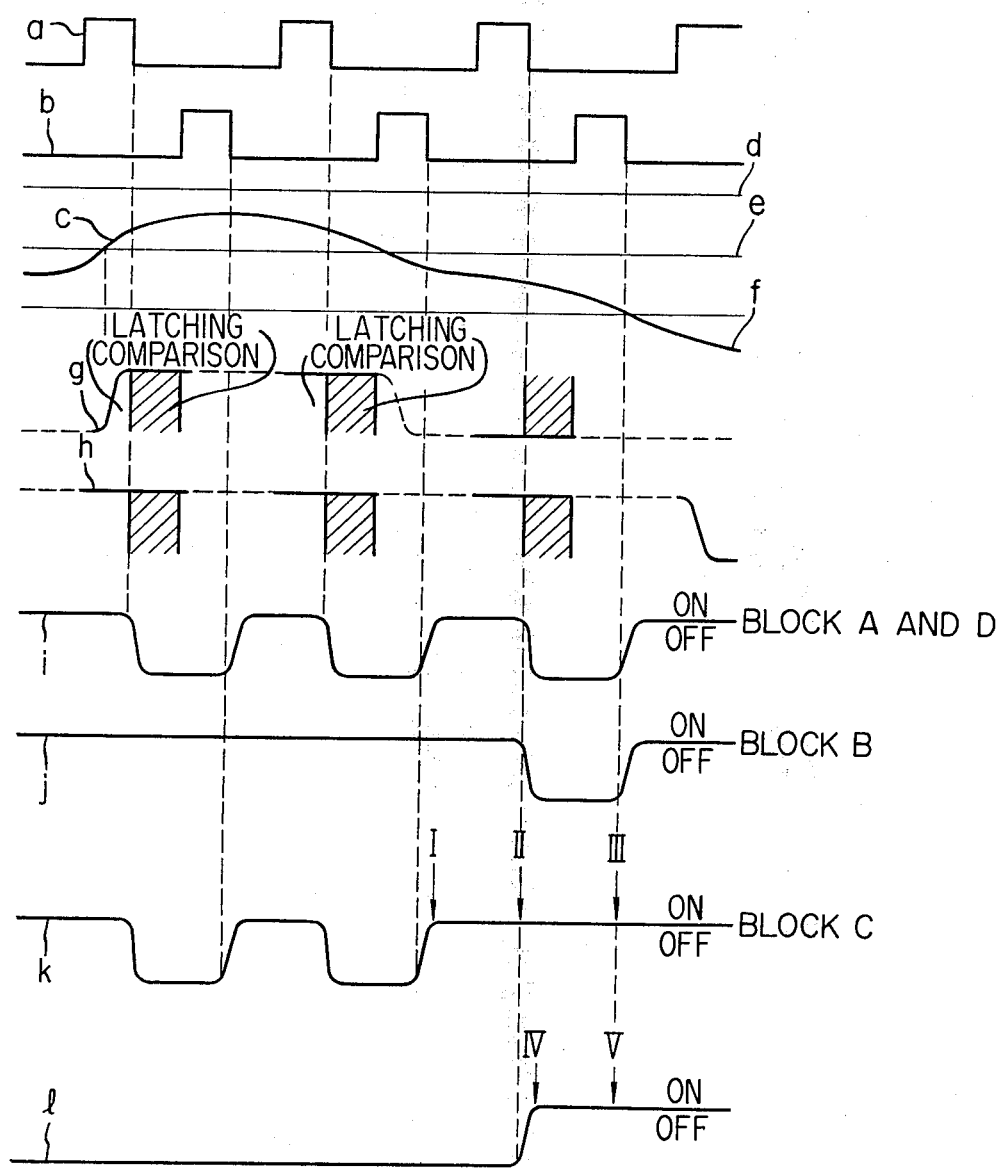
FIG. 13 is a timing diagram used for an explanation of a second clock system in accordance with the present invention.

Second Embodiment of Clock System, FIG. 13

In FIG. 13, signals a and b represent, respectively, the clocks in response to which the sub-comparators may be operated and the clocks in response to which the comparators in the blocks may be operated. The signal a falls in synchronism with the fall of the clock signal $\phi_0$, and the signal b is lagged behind the signal a by a phase equal to one half of the frequency of the clock signal $\phi_0$. The signal c is the analog input. Signals d, e and f are reference voltages of the sub-comparators $SC_1$ through $SC_3$ shown in FIG. 4. The signal g is the output from the sub-comparator $SC_2$. The signal h represents the output from the sub-comparator $SC_3$. The solid curves of signals g and h represent the comparison operation respectively while the dashed curves represent the latching operation. According to this embodiment, when the sub-comparators $SC_1$ through $SC_3$ start the comparison operations, the comparators in all blocks A through D are immediately enabled. When sub-comparators $SC_1$ through $SC_3$ are latched, the comparators in each block which is associated with the latched sub-comparator are disabled in response to the output from the latched sub-comparator when the comparison of the analog input signal with the quantizing levels of the comparators is not needed. In this embodiment, at the trailing edge of the signal b, the comparator block is enabled, so that the comparators in the blocks A and D are alternately enabled and disabled at a one-half cycle frequency as indicated by signal i. The comparators in the block C are also alternately enabled and disabled at a one-half cycle frequency until the time point I is reached and are kept energized after time point II in response to the output from the associated sub-comparator $SC_3$ as indicated by signal k. As a result, when the comparison operations are started at time point III, the comparators in the block C have been energized for a relatively long interval of time since the time point I so that the power source noise generated at the time point I may be sufficiently suppressed when comparison is made. Especially in the case of the high-speed comparator, in accordance with the present invention, damping of power source noise cannot be neglected when the clock frequency exceeds 10 MHz. Therefore, the clock system described above is very effective in eliminating noise. The signal 1 indicates adverse effects caused when the clock system of the present invention is not employed. That is, in response to the output from the associated sub-comparator, the voltage applied to the comparators rises sharply at the time point IV and the time interval between the time point IV, and the time point V when the comparison operation is started is too short for the video input signal which varies sharply. As a result, when ringing occurs, an erratic operation may result.

Next, the power saving attained by disabling the comparators which need not be operated will be described. In general, the video signal will not change too rapidly. As a result, for a short interval of time, only one comparator block or only a small fraction of the comparator blocks are enabled. That is, the ratio of the enabled comparator block or blocks to the disabled comparator blocks is very small. In other blocks, because the current therein is turned on and off at a 1:1 duty ratio, a 50% power reduction can be attained. As a consequence, in the case of the parallel type A/D converters whose power is mainly consumed by the comparators, the power reduction ratio reaches 30 to 40%, which is very effective. In addition, according to the present invention, the comparators have been enabled or energized for a relatively long time before the comparison operation is started so that the power source noise may be almost completely ignored. As described above, according to the present invention, the sub-comparators and comparators are alternately operated. After one cycle of holding the comparators, all of the comparators are enabled and in response to the outputs from the sub-comparators, the supply of current to the comparator blocks which are not needed is decreased. In this embodiment, the source voltage is raised before the time point when the comparison by comparators in each block is made by one or two clocks. In this case, the video signal must be temporarily stored as the analog signal, so that it must be expected that the system will become more complex in construction. In the case of NTSC system, the video signal is 3.58 MHz and in the case of PAL system it is 4.5 MHz. The sampling frequency ranges from 14 to 18 MHz, that is, four times the video signal. However, generally, the video signal will not vary so sharply. For instance, in the case of the 8-bit A/D converter in which 256 comparators are arranged, an optimum number of the sub-comparators is 16. That is, one sub-comparator is provided for every 16 comparators. As a result, generally, it takes a relatively long time interval before the analog signal, even if it varies very rapidly, may vary across the quantizing levels of two sub-comparators. Thus, it is not preferable to normally maintain all the sub-comparators energized.

In order to transmit the output from the sub-comparator to the comparators in the associated block with a delay shorter than one cycle, the circuit for processing the outputs from the sub-comparators and the comparator control system for selectively enabling and disabling the comparator blocks must be operated at considerably high speeds. To this end, a large power supply is necessary so that the power reduction, which is the primary object of the present invention, cannot be attained. Therefore, according to the present invention, the speed of the sub-comparators is sufficiently reduced. For instance, the output from the sub-comparator is used for every 10 clocks in order to control the power supply to the comparator in the block. As a result, the power consumption by the sub-comparators may be decreased, and there may be provided a system which is simple in construction without the use of high-speed logic elements for controlling the power supply to the comparator blocks. One embodiment thereof will be described with reference to FIG. 14 and TABLE 4 below.

TABLE 4

| outputs of sub-comparators | $SC'_1$ | 0 | 0 | 0 | 0 | 1 |
|---|---|---|---|---|---|---|
| | $SC'_2$ | 0 | 0 | 0 | 1 | 1 |
| | $SC'_3$ | 0 | 0 | 1 | 1 | 1 |
| | $SC'_4$ | 0 | 1 | 1 | 1 | 1 |
| outputs of comparator blocks | A | OFF | OFF | OFF | ON | ON |
| | B | OFF | OFF | ON | ON | OFF |
| | C | OFF | ON | ON | OFF | OFF |
| | D | ON | ON | OFF | OFF | OFF |

So far, the reference voltage of the sub-comparator has been described as being equal to the lowest reference voltage or quantizing level of the associated comparator block, but in the embodiment described below, the sub-comparators $SC'_1$ through $SC'_4$ for the comparator blocks A through D have the reference voltages slightly higher than the lowerst reference voltages or quantizing levels of the blocks A through D. As a consequence, in response to the outputs from the sub-comparators $SC'_1$ through $SC'_4$, the comparator blocks A through D are turned on or off as shown in TABLE 4.

Figure 14:
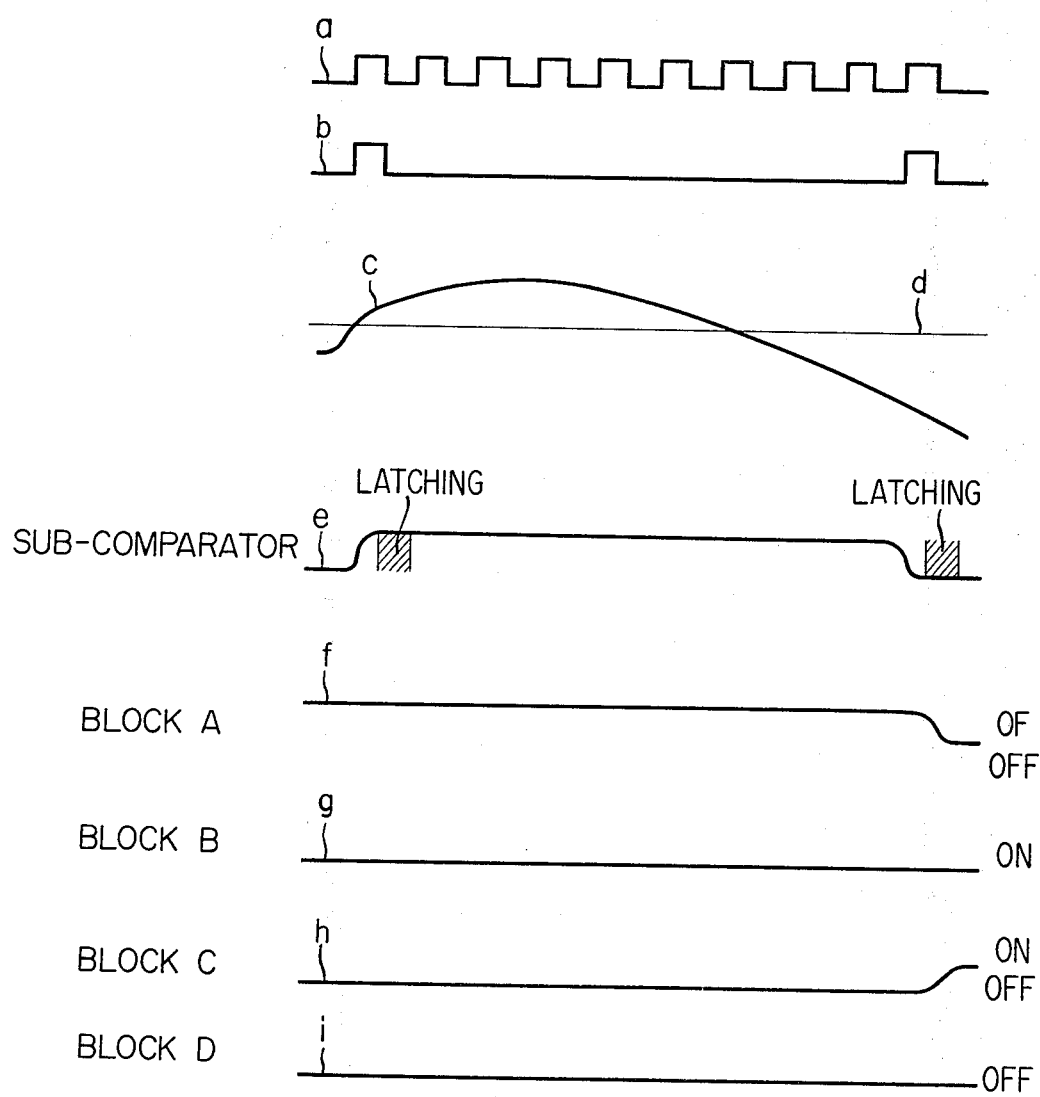
FIG. 14 is a timing diagram used for an explanation of a third clock system in accordance with the present invention.

In FIG. 14, signal a is the clock pulse for driving the comparators which constitute the blocks A through D and is assumed to have a frequency between 14 and 18 MHz. Signal b is the clock pulse for driving the sub-comparators $SC'_1$ through $SC'_4$. One level signal is generated for every ten fundamental pulses. Signal c is the analog input signal. One reference voltage d is used as a comparison voltage for the sub-comparator $SC'_2$. Signal e represents the output of the sub-comparator $SC'_2$. One level is held until the second pulse of the signal b appears. The comparators in the selected block in response to the output from the associated sub-comparator, compare the analog input signal c ten times during the time interval from the first to the second pulse of the signal b. Signals f through i indicate the variations in power source voltage applied to the blocks from A to D. During the 10 pulse period that is, within about 700 nS in the case of the clock pulses of 14 MHz, the variation of the analog signal is less, so that the block D is normally maintained de-energized while the block B is normally maintained energized. The transition from OFF to ON of the block C occurs because the output from the sub-comparator $SC'_2$ changes from "1" to "0" in response to the second pulse of the signal b, so that the power may be gradually applied thereto. Even when the power is gradually applied to, the transition of the state of the sub-comparator occurs at every 10 pulses, so that no problem results.

As described above, in one feature of the present invention, sub-comparators are provided so that for a predetermined time interval, some comparators are energized or enabled while the remaining comparators are de-energized or disabled; that is, the current supplied to the remaining comparators is cut off or decreased to a low level. As a result, there may be provided an A/D converter which may operate at an extremely higher degree of accuracy and may consume less power without the sacrifice of a high-speed operation which is one of the most desirable features of the parallel type comparison systems.

However, when the number of comparator blocks is increased in order to reduce the power consumption, the problem of accuracy arises when the input signal of high frequencies is processed.

The reason is that, in practice, a time delay occurs between the starts of the comparison operations by the sub-comparators and normal comparators. Therefore, when the input signal at a high frequency is applied, there is a difference between the input signal level detected by the sub-comparator and the levels of the signals applied to the normal or main comparators. If the level of the input signal applied to the normal or main comparator should not coincide with the reference voltage level of the normal or main comparator block which is energized or enabled, an error may result. In order to overcome this problem, it may be proposed to increase the number of comparators in each block while decreasing the number of comparator blocks, but the reduction in power consumption cannot be attained.

Therefore, the embodiment shown below is a first system for overcoming this problem. When the comparators are divided into groups, a weighting system is employed in such a way that a comparator block which has the reference voltage range through which the level of the input signal varies rapidly during a predetermined time interval may include a large number of comparators while a comparator block which has the reference voltage range through which the level of the input signal varies slowly during a predetermined time interval may include a lesser number of comparators whereby the reduction in power consumption may be attained.

More specifically, the comparators, each of which has the reference level corresponding to the quantizing level and which are arranged in parallel with each other, are weighted and divided into a plurality of groups. Prior to the comparison operation by the comparators, the comparison of the analog signal by the sub-comparators is made, and in response to the result of this comparison, the comparison operation only by the group which is selected may be initiated.

A further embodiment of the present invention will be described in conjunction with the accompanying drawings. Assuming that the analog signal to be applied to the A/D converter is the video signal, then the color subcarrier has the highest frequency and a sinusoidal waveform. That is, when the sinusoidal waveform of 3.58 MHz is converted in an NTSC system, the conversion of the video signal into the digital signal is possible.

Figure 15:
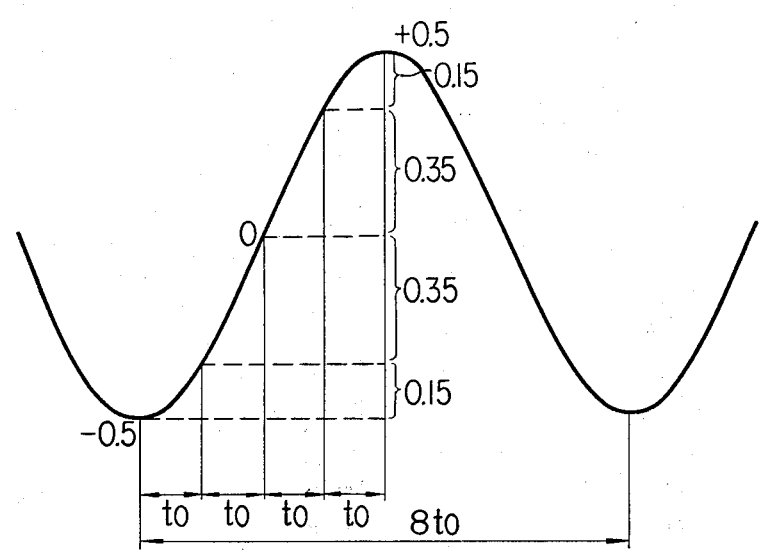
FIG. 15 is a diagram used for the explanation of the underlying principle of a fourth embodiment of the present invention.

As shown in FIG. 15, the amplitudes which vary within a predetermined time interval are different depending upon the level of the signal. That is, the amplitude varies most remarkably when the wave or voltage crosses "0". Assume that the whole period is 8 $t_0$, then the amplitude changes 0.35 of the whole amplitude during $t_0$, but as the voltage approaches its peak, the variation or increase in amplitude is only 0.15. Therefore, it follows that when the comparators are divided into blocks, it is most efficient to allocate the number of comparators included in the blocks based upon the ratio described above.

Figure 16:
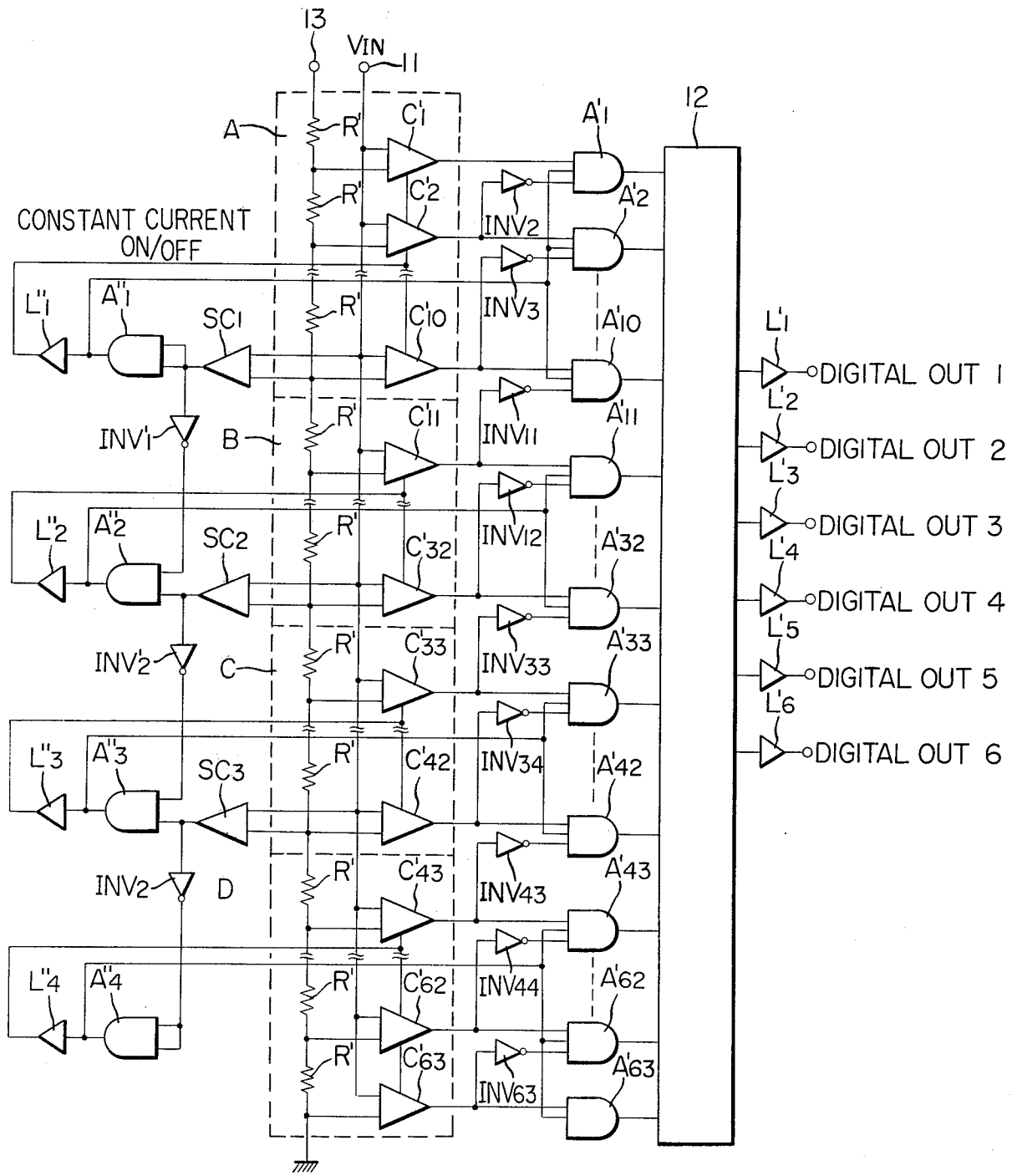
FIG. 16 is a block diagram of the fourth embodiment of the present invention.

FIG. 16 illustrates a practical arrangement in which the comparators are divided into blocks based upon the ratio described above. FIG. 16 illustrates an example of a 6-bit A/D converter and the components shown therein are substantially similar to those shown in FIG. 4. When comparators $C'_1$ through $C'_{63}$ are divided into groups, they are divided at the weighted ratio described above. The reference voltages equal to those of the 10-th, 32-th and 42-th of normal comparators $C'$ are applied to one input of sub-comparators $SC_1$ through $SC_3$. Therefore, sub-comparator $SC_1$ has the same comparison level as comparator $C'_{10}$; subcomparator $SC_2$ has the same comparison level as comparator $C'_{32}$; and sub-comparator $SC_3$ has the same comparison level as comparator $C'_{42}$. Block A includes comparators from $C'_1$ to $C'_{10}$; block B, from $C'_{11}$ to $C'_{32}$; block C, from $C'_{32}$ to $C'_{42}$; and block D, from $C'_{43}$ to $C'_{63}$. Next, the mode of operation of the embodiment shown in FIG. 16 will be described. The analog input signal applied to input terminal 11 is compared with the voltages corresponding to sub-comparators $SC_1$ through $SC_3$. Assuming that the reference voltage applied to terminal 13 is 1 V, then the comparison levels of sub-comparators $SC_1$ through $SC_3$ are 0.844 V, 0.5 V and 0.156 V, respectively. If the analog input signal is 0.6 V, sub-comparator $SC_1$ detects that the input signal is lower than the comparison level and generates output "0", but the sub-comparators $SC_2$ and $SC_3$ detect that the input signal is higher than their comparison levels and generate output "1" respectively. As a result, the outputs from inverters $INV'_1$ through $INV'_3$ are "1", "0" and "0", respectively. As a consequence, only AND gate $A''_2$ receives two inputs which are "1" while the inputs to the remaining AND gates $A''_1$, $A''_3$ and $A''_4$ are "0" and "1" or "0" and "0", respectively. As a result, only the output from AND gate $A''_2$ is "1" while the outputs from the other AND gates are "0", respectively. The outputs of AND gates $A''_1$ through $A''_4$ are connected to the third input of AND gates $A'_1$ through $A'_{63}$ interposed between the normal or main comparators and the encoder 12. More specifically, the output of AND gate $A''_1$ is connected to the input of AND gates $A'_1$ through $A'_{10}$ in the block A; the output of AND gate $A''_2$ is connected to the input of AND gates $A'_{11}$ through $A'_{32}$ in the block B; the output of AND gate $A''_3$ is connected to the input of AND gates $A'_{32}$ through $A'_{42}$ in block C; and the output of AND gate $A''_4$ is connected to the input of AND gates $A'_{43}$ through $A'_{63}$ in block D. Since the output from AND gate $A''_2$ is "1" while the outputs from AND gates $A''_1$, $A''_3$ and $A''_4$ are "0", only AND gates $A'_{11}$ through $A'_{32}$ in block B are opened while the outputs from AND gates in other blocks are forced to become "0", respectively. This is a circuitry which ensures the correct input to the encoder 12 regardless of the output conditions of the normal or main comparators which are not energized or enabled.

Buffer drivers $L''_1$ through $L''_4$ control the supply of current to comparators $C'_1$ through $C'_{63}$ which are divided into blocks. When the circuitry shown is so designed and constructed that when and only when the inputs to the buffer drivers $L''_1$ through $L''_4$ are "1", the current may flow to comparators $C'_1$ through $C'_{63}$, only comparators $C'_{11}$ through $C'_{32}$ are energized or enabled when the output from AND gate $A''_2$ is "1" while the remaining comparators are all de-energized or disabled. This operation is substantially similar to that of the prior art A/D converters. In this case, when the operation is suspended by cutting off the comparison operation current to the other comparators, the comparators which are operating are 22 comparators in block B, so that the power consumption by the comparators may be reduced to about ⅓. However, three sub-comparators must always be energized or maintained enabled. The power or current consumption increases accordingly, but the number of the sub-comparators is by far less than the number of normal or main comparators, so that the power or current consumption by the sub-comparators is negligible.

Since block B is energized or enabled as described above, the current consumed is only about ⅓, so that as compared with the arrangement shown in FIG. 4 in which the blocks have the same number of comparators, the arrangement shown in FIG. 16 is disadvantageous. However, when blocks A and D are actuated, the number of 10 comparators are energized or enabled in each block. As a result, the power consumption becomes about 1/6 and approaches about ¼ when averaged. In this embodiment, 63 comparators (6 bits) are divided by four so that this embodiment has no remarkable merit as compared with the embodiment shown in FIG. 4. The division by four is however for the sake of explanation, and as the divisor is increased as 8, 16 and so on, the frequency of erratic operations increases in the embodiment shown in FIG. 4, so that the number of divisions cannot be increased. On the other hand, according to this embodiment, even when the number of divisions is increased, no erratic operation will occur. Therefore the A/D conversion of the analog input signal of high frequencies becomes feasible.

TABLE 5 shows the states or conditions of the sub-comparators when blocks A through D (except block B) are energized, the comparator blocks A through D and the AND gate blocks A through D being selectively energized in response to the ranges of the analog input signals.

TABLE 5

| voltage of analog input signal | | 0 to 0.156 | 0.156 to 0.5 V | 0.5 to 0.844 | 0.844 to 1 V |
|---|---|---|---|---|---|
| outputs of sub-comparators | SC$_1$ | 0 | 0 | 0 | 1 |
| | SC$_2$ | 0 | 0 | 1 | 1 |
| | SC$_3$ | 0 | 1 | 1 | 1 |
| comparator blocks | A | OFF | OFF | OFF | ON |
| | B | OFF | OFF | ON | OFF |
| | C | OFF | ON | OFF | OFF |
| | D | ON | OFF | OFF | OFF |
| AND gate blocks | A | 0 | 0 | 0 | — |
| | B | 0 | 0 | — | 0 |
| | C | 0 | — | 0 | 0 |
| | D | — | 0 | 0 | 0 |

Next, a second effective system for processing the high frequency input signals will be described.

Figure 17:
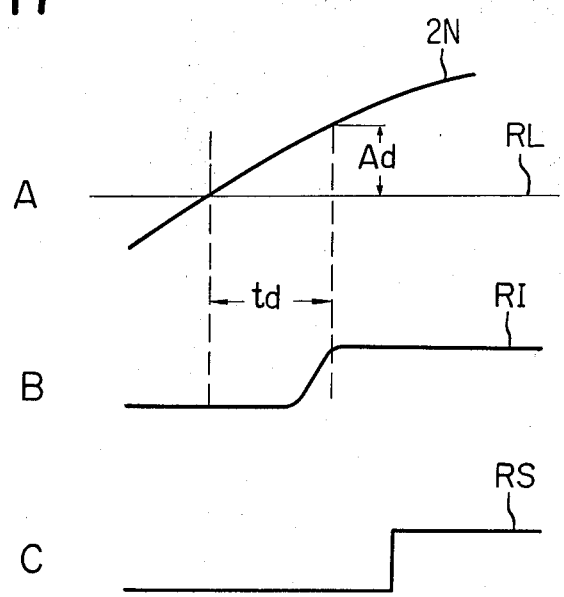
FIG. 17 is a diagram used for an explanation of the problems encountered when the input signal of a high frequency is received.

FIG. 17 shows the chart used for the explanation of the problems which occur when the input signal has a high frequency and is at a maximum amplitude.

As indicated at A and B in FIG. 17, there is a predetermined time delay td between the time point when the input signal IN exceeds a reference or comparison level RL of a certain sub-comparator and the time point when the current RI supplied to the predetermined normal or main comparator group rises so that the comparators are energized or enabled. During this time delay td, the level of the input signal changes from time to time. As a result, the level of the input signal which is detected by the normal or main comparators is raised or deviated by at least Ad as compared with the level which the sub-comparators have detected. This deviation Ad becomes substantially large when the input signal has a high frequency. The reference RS represents the latching signal for sampling the input signal IN. For instance, assume that the input signal has a frequency of 4 MHz and a sinusoidal waveform and that td is equal to 10 ns at a maximum amplitude, then.

$$Ad = \sin \omega \cdot td \quad (1)$$

Hence, Ad=0.25. That is, the deviation is about 0.25 MSB. In the case of the 8-bit A/D converter, 1 MSB is equal to 256 LSB so that the deviation is 64 LSB. As a result, in order to compensate for this deviation, at least 64 comparators must be energized or enabled simultaneously. This means that the normal or main comparators can be divided into only four blocks at the most so that as compared with the prior art parallel type A/D converters, the power reduction of only from $\frac{1}{3}$ to $\frac{1}{4}$ may be attained. However, an ideal system may accomplish the reduction of the power consumption to about $\frac{1}{8}$.

Therefore in this embodiment, which is the second system, a phase circuit is provided so that the difference in level between the input signal detected by the sub-comparators and the input signal detected by the normal or main comparators may be minimized as practically as possible, whereby the above-described problem may be obviated.

Figure 18:
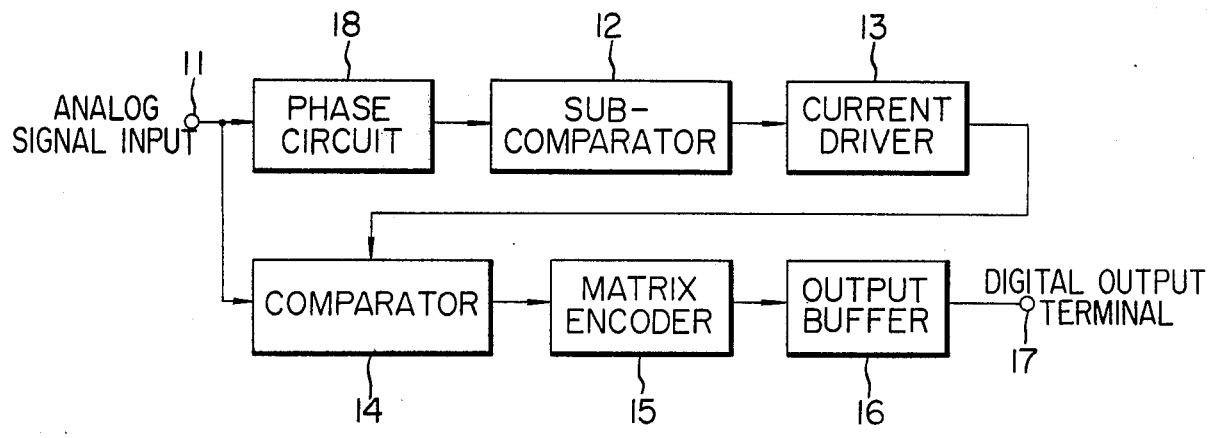
FIG. 18 is a block diagram of a fifth embodiment of the present invention.

A further embodiment of the invention will be described in more detail with reference to the accompanying drawings. FIG. 18 shows a further embodiment of the present invention. Numeral 11 is an analog signal input terminal; 12, a sub-comparator; 13, a current driver which is responsive to the output from sub-comparator 12 for energizing or enabling some predetermined comparators 14; 15, a matrix encoder for coding the output from the comparator into a digital signal of n bits; and 16, an output buffer whose output appears at a digital output terminal 17. Numeral 18 is a phase circuit which is one of the essential features of the present invention. Phase circuit 18 advances the phase of the input signal to be applied to the sub-comparator whereby the time delay caused in the sub-comparator 12 and the current driver 13 may be thereby compensated.

Figure 19:
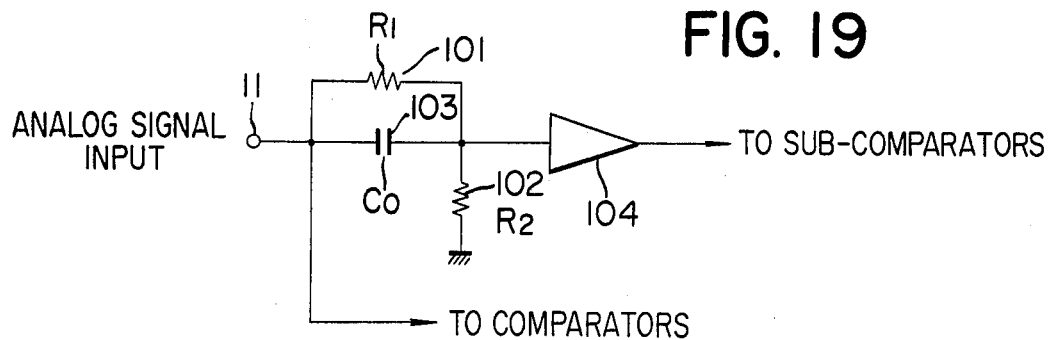
FIG. 19 is a diagram of a phase circuit in accordance with the present invention.
Figure 20:
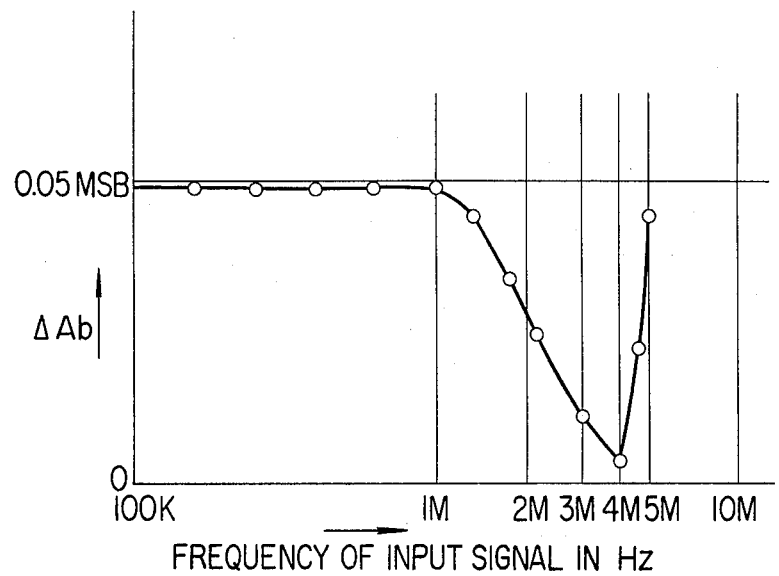
FIG. 20 is a diagram used for an explanation of the mode of operation of the fifth embodiment shown in FIG. 18.

FIG. 19 shows one example of the phase circuit 18. Numeral 11 is the analog input terminal as in the case of the system shown in FIG. 18. Numeral 101 and 102 are resistors; 103, a capacitor; and 104, an amplifier.

Next, the characteristics of the phase compensation accomplished by the circuit shown in FIG. 19 will be described. If a denotes the gain of the amplifier 104 and $t_d$ denotes a time delay through the sub-comparator and current driver described above, then the transmission characteristic of the whole system may be expressed by $$G = A \cdot a \cdot \frac{1 + j\omega\tau}{1 + j\omega a\tau} \cdot e^{-j\omega \cdot t_d} \quad (2)$$

where $$\tau = R_1 \cdot C_0 \quad (3)$$

$$a = R_2/(R_1 + R_2) \quad (4)$$

Phase P and the absolute value of $A_b$ of the transfer function given by Eq. (2) may be expressed as follows:

$$P = \tan^{-1}(\omega\tau) - \tan^{-1}(\omega\tau a) - \omega \cdot t_d \quad (5)$$

and $$A_b = A \cdot a \sqrt{\frac{1 + (\omega \cdot \tau)^2}{1 + (\omega \cdot \tau \cdot a)^2}} \quad (6)$$

Therefore, the difference between the analog input signal applied to the terminal 11 and the signal whose transfer function is expressed by Eq. (2) may be expressed by $$\Delta A_b = \sqrt{1 + A_b^2 - 2 \cdot A_b \cos P} \quad (7)$$

In order to establish an ideal system, the values of $R_1$, $R_2$ and C and the amplification factor A of the amplifier 104 must be so selected so that the $\Delta A_b$ may become zero, respectively. However, in practice, it is impossible to make $\Delta A_b$ zero throughout the whole range or band of the input signal applied to the A/D converter. However, when the above constants are suitably selected, the value of $\Delta A_b$ may be made sufficiently small. Then, the number of comparators which must be energized or enabled simultaneously may be reduced and consequently the power consumption may be reduced by about ⅓ to ¼ as compared with the prior art A/D converters.

For instance, when td is equal to 15 ns, $R_1$ is equal to 3 KΩ, $R_2$ is equal to 1.3 KΩ, $C_0$ is equal to 5 PF and A is equal to 3.2 and if the highest frequency of the input signal is less than 5 MHz, ΔAb may be held within 0.05 MSB.

That is, the number of comparators which are energized or enabled simultaneously may be reduced to 1/20 of the total number of comparators.

From the standpoint of the overall power consumption, the highest efficiency may be attained when the number of comparators which are energized or enabled simultaneously is $2^{n/2}$. Therefore, the number of comparators which must be energized or enabled simultaneously must be determined depending upon the number of bits used.

As described above, there is provided the phase advancer 18 which is interconnected between the input signal terminal and the sub-comparator and comprises the resistors and capacitor $C_0$. Therefore, the time delay caused through the sub-comparator and the current driver may be compensated for and the differences both in phase and absolute value between the input signal directly applied to the comparator 14 and the input signal applied thereto indirectly through the sub-comparator 12 and the current driver 13 may be minimized as much as possible. Alternatively, a phase delaying circuit may be interconnected between the input signal terminal 11 and the comparator 14. However, when the input signal is applied to the normal or main comparator 14 through the phase delaying circuit, a degradation in precision of the A/D converter itself results. In addition, in order to attain excellent delay characteristics, the time delay circuits must in general include inductance so that they are not adapted for integrated circuits.

On the other hand, according to the present invention, the input signal may be directly applied to the comparator. As a result, a higher degree of accuracy may be maintained. In addition, phase circuit 18 may be easily incorporated in the integrated circuits because it consists only of the resistors and the capacitor $C_0$.

In the phase advancer shown in FIG. 19, the amplifier 104 is incorporated in order to set a desired transfer function of the whole system. However, the amplifier is not needed to obtain the amplification factor A. The same effects may be attained by setting the ratio between the reference voltages of the sub-comparator and the normal or main comparator to A.

In summary, the present invention provides a parallel type A/D converter which is simple in construction, is adapted to be incorporated in the integrated circuits or the like, may decrease the power consumption to a considerable degree and may operate without causing any degradation in conversion speed and precision.

What is claimed is:

1. A fully parallel threshold type A/D converter for an input signal having a predetermined voltage range, comprising:

A plurality of comparators each of which has a fixed reference voltage corresponding to a quantizing level and which are disposed in parallel with each other, said comparators being divided into a plurality of blocks; and a sub comparator operatively associated with each of said comparator blocks, whereby the input signal is first compared by the sub-comparators and then compared by the comparators in one comparator block selected and supplied with power in response to the output from the associated sub-comparator, said reference voltages encompassing the full range of said input signal and remaining unchanged during the operation of both the sub-comparators and the comparators of said converter.

2. A parallel threshold type A/D converter as set forth in claim 1 wherein during the holding period of the comparators, the comparison by the sub-comparators for the next conversion cycle and the switching of operating current of said comparators are carried out; and the comparison by the sub-comparators is started immediately after the holding is started and after a predetermined time delay said switching is started.

3. A fully parallel threshold type A/D converter for an input signal having a predetermined voltage range, comprising:

a plurality of comparators each of which has a fixed reference voltage corresponding to a quantizing level and which are disposed in parallel with each other, said comparators being divided into a plurality of blocks, the relative numbers of comparators in said blocks being weighted in a ratio corresponding to the variations in level of a sinusoidal signal wave within the corresponding intervals; and a sub-comparator operatively associated with each of said comparator blocks, whereby the input signal is first compared by the sub-comparators and then compared by the comparators in one comparator block selected and supplied with power in response to the output from the associated sub-comparator, said reference voltages encompassing the full range of said input signal and remaining unchanged during the operation of both the sub-comparators and the comparators of said converter.

4. A fully parallel threshold type analog-to-digital converter for an input signal having a predetermined voltage range, comprising:

a plurality of comparators connected in parallel;

means for supplying each comparator with a different fixed quantizing level reference voltage and an analog input signal to be compared therewith, said reference voltages spanning the range of anticipated values of said input signal in a number of groups, each group of reference voltages being associated with a corresponding block of comparators;

at least three sub-comparators connected in parallel with said comparators, the number of sub-comparators being at least equal to the number of comparator blocks minus one;

means for supplying each sub-comparator with a different fixed quantizing level reference voltage and said input signal to be compared therewith, the reference voltage supplied to each sub-comparator corresponding to the reference voltage applied to a comparator at an extreme of a corresponding block, so that the outputs of said sub-comparators uniquely define the particular block including a comparator with a reference voltage corresponding to the value of the input signal;

said reference voltages encompassing the full range of said input signal and remaining unchanged during the operation of both the sub-comparators and the comparators of said converter;

means responsive to the outputs of said sub-comparators for supplying power to the comparators of said particular block; and logic and encoding means responsive to the comparator outputs for providing a digital code signal having a value corresponding to the value of said analog input signal.

* * * * *